United States Patent [19]
Suzuki

[11] Patent Number: 6,104,472
[45] Date of Patent: *Aug. 15, 2000

[54] PROJECTION EXPOSURE APPARATUS AND DEVICE MANUFACTURING METHOD

[75] Inventor: Akiyoshi Suzuki, Tokyo, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/998,708

[22] Filed: Dec. 29, 1997

[30] Foreign Application Priority Data

Dec. 28, 1996 [JP] Japan .................................. 8-357746

[51] Int. Cl.$^7$ .......................... G03B 27/42; G03B 27/54
[52] U.S. Cl. .............................................. 355/53; 355/67
[58] Field of Search .................. 355/40, 53, 56, 355/55, 67, 77; 356/399, 400, 401; 250/548, 492.22; 430/5, 30

[56] References Cited

U.S. PATENT DOCUMENTS

| | | | |
|---|---|---|---|
| 4,688,904 | 8/1987 | Hirose et al. | 350/443 |
| 4,688,932 | 8/1987 | Suzuki | 355/51 |
| 4,798,450 | 1/1989 | Suzuki | 350/505 |
| 5,291,240 | 3/1994 | Jain | 355/53 |
| 5,381,210 | 1/1995 | Hagiwara | 355/53 |
| 5,392,119 | 2/1995 | McArthur et al. | 356/355 |
| 5,572,288 | 11/1996 | Mizutani | 355/53 |
| 5,610,684 | 3/1997 | Shiraishi | 355/55 |
| 5,661,546 | 8/1997 | Taniguchi | 355/53 |
| 5,677,757 | 10/1997 | Taniguchi et al. | 355/71 |
| 5,686,984 | 11/1997 | Suzuki | 355/53 |
| 5,774,205 | 6/1998 | Sato | 355/67 |
| 5,789,734 | 8/1998 | Torigoe et al. | 250/201.2 |
| 5,822,043 | 10/1998 | Ebinuma | 355/55 |

FOREIGN PATENT DOCUMENTS

| | | |
|---|---|---|
| 43-10034 | 4/1943 | Japan . |
| 43-10034 | 4/1968 | Japan . |
| 4-367213 | 12/1992 | Japan . |
| 6-326000 | 11/1994 | Japan . |
| 7-183190 | 7/1995 | Japan . |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

A projection exposure apparatus includes a projection optical system for projecting a pattern of a mask onto a substrate. The projection optical system includes a pair of aspherical members, at least one of which is displaceable in a direction orthogonal to an optical axis of the projection optical system. The aspherical members have aspherical surface shapes which are determined so that an optical characteristic of the aspherical members as a unit changes with a change in positional relationship between the aspherical surfaces of the aspherical members with respect to the orthogonal direction. Also, an optical characteristic of the projection optical system is adjustable in response to displacement of the at least one of the aspherical members in the direction orthogonal to the optical axis.

21 Claims, 20 Drawing Sheets

PROJECTION EXPOSURE APPARATUS AND DEVICE MANUFACTURING METHOD

BACKGROUND OF THE INVENTION

Field of the Invention and Related Art

This invention relates to a projection exposure apparatus and a device manufacturing method using the same. For example, the invention is suitably applicable, in the manufacture of semiconductor devices such as ICs or LSIs, image pickup devices such as CCDs, display devices such as liquid crystal panels or other devices such as magnetic heads, to a lithographic process wherein a pattern formed on a mask or reticle is printed or scanningly printed on a wafer through a projection optical system, whereby high density devices are produced.

The present invention is particularly suitably applicable to a case where a reticle and a silicon wafer are registered (aligned) precisely with each other and an electronic pattern on the surface of the reticle is printed on the wafer surface by projection exposure or scanning projection exposure.

For the manufacture of semiconductor devices or liquid crystal panels, for example, on the basis of photolithography, a projection exposure apparatus (called a "stepper") is used by which a pattern formed on the surface of a reticle is transferred by exposure through a projection optical system onto a photosensitive substrate such as a wafer or glass plate having a photoresist coating.

Recent semiconductor technology has been advanced considerably in the point of miniaturization, and resolution for a linewidth of 0.25 micron or narrower is now under discussion. One major technique for this is an optical exposure technique which might be represented by a stepper. Generally, the performance of a projection lens (projection optical system) which may be an index for the performance of an optical exposure process includes three aspects, that is, narrowing of wavelength, enlargement of picture field and enlargement of numerical aperture (NA). In relation to bandwidth narrowing, development of lithography that uses light of an ArF excimer laser has been attempted widely, as the next generation technology.

For the optical exposure technique, there is a factor that the same optical performance should be held continuously. In the case of lithography that uses an ArF excimer laser, there is absorption of light by a usable glass material, and it is known that the optical performance of a projection optical system is variable due to such absorption of light. The absorption of light is already known even in the case of lithography that uses light of i-line, for example. Since a stepper having an ArF excimer laser has a decreased depth of focus of a projection optical system, the optical performance should be controlled more precisely than before. Of such optical performance to be controlled, there are aberrations of a projection optical system. Those of these aberrations which are most difficult to be corrected are axial (axial) astigmatism, curvature of image field, and third-order (cubic) or higher-order distortion. Further, correction of revolutionally asymmetric magnification of an object itself may be an additional problem to be solved.

Axial astigmatism will be explained below, with reference to an example. For enlargement of a region on the wafer surface to be exposed, development of a scan type projection exposure apparatus (called a "scanner") has recently been made widely, wherein an illumination region of a slit-like shape is defined and wherein a reticle and a wafer are scanningly moved relative to the slit shape, in synchronism with each other. When such slit-like exposure light is used, since the shape of the slit is not revolutionally symmetrical, absorption of light by the glass material may cause an asymmetric thermal distribution with respect to the optical axis which may result in astigmatism (axial astigmatism) of the projection optical system.

Next, revolutionally asymmetric magnification will be explained. As one factor required for an optical exposure technique for the manufacture of semiconductor devices, in addition to improvement of resolving power, there is registration (alignment) precision for patterns to be superposed one upon another in several layers.

A frequently used alignment process is one called a "global alignment method". Errors in such a global alignment procedure may be classified generally into two, that is, an inter-shot component (an error between different shots) and an intra-shot component (an error within one shot). Because of recent enlargement of picture field size, how to reduce the error of the intra-shot component is now a problem to be considered. For an actual wafer, there occurs asymmetrical distortion in dependence upon the process adopted.

For example, if, for a picture field size of 22 mm, there is an error of 2 ppm in terms of magnification, as a component which is asymmetric and cannot be corrected, it means that there is an error of 22 mm×1 ppm=44 nm. For resolution performance of 0.25 micron linewidth, such error has a value of about 1/5×. From the standpoint of registration budget, clearly such a value is out of tolerance. Thus, to reduce the intra-shot component is an important problem to be solved in optical exposure apparatuses.

As regards distortion, there are known measures to control magnification and third-order distortion. An example is that plural elements within a projection optical system are displaced along the optical axis direction, or the pressure of a gas sealingly provided between optical elements is changed. Since magnification is a fundamental quantity of an optical system, it can be changed without changing the other aberrations. As regards correction of third-order distortion, however, there is a problem of changes in aberration resulting from displacement or a problem of a small range of adjustment. Thus, correction has to be taken into account even in the initial stage of design. Particularly, in consideration of the use of different imaging methods such as a modified illumination method and a phase shift mask, for example, there will occur a problem of matching of distortion in these imaging methods. It is, therefore, important to control third-order distortion without any additional burden to design.

Higher-order distortion will now be explained. In a scan type projection exposure apparatus, an asymmetric magnification difference such as, for example, a magnification difference between X and Y axes which are in directions perpendicular to the optical axis can be corrected by the scanning. Also, as regards the scan direction, distortion may be averaged due to the averaging effect resulting from the scanning. For example, if the slit is elongated in the X direction and the scan is made along the Y-axis direction, the result of scanning is that the magnification in the Y direction can be adjusted by controlling the synchronism of scan, and that optical distortion of third-order or fifth-order, for example, can be suppressed to a small value due to the averaging effect within the slit. As regards the X direction, however, there is no averaging effect. It is, therefore, necessary to optically control the distortion with high precision.

Japanese Laid-Open Patent Application, Laid-Open No. 183190/1995 shows a projection exposure apparatus wherein a revolutionally asymmetric optical characteristic remaining in a projection optical system, for projecting a pattern of a mask onto a wafer, with respect to an optical axis of the projection optical system is made adjustable.

In the arrangement of the aforementioned Japanese Laid-Open Patent Application, Laid-Open No. 183190/1995, when a cylindrical lens having a revolutionally asymmetrical power is driven, it produces variations in plural aberrations. Therefore, it is difficult to correct only an aberration which is just to be corrected.

SUMMARY OF THE INVENTION

It is an object of the present invention to provide an improved projection exposure apparatus and/or a device manufacturing method using the same, wherein a pattern of a mask is projected onto a substrate so that the substrate is exposed to the mask pattern.

In a projection exposure apparatus according to an aspect of the present invention, there are a pair of transparent aspherical surface members having their aspherical surfaces disposed opposed to each other, wherein one of the aspherical surface members is movable in a direction crossing the light path, and wherein the movement of the one aspherical surface member causes a change in surface shape corresponding to a difference between aspherical surfaces of the paired aspherical surface members which, in turn, causes a change in optical characteristic or characteristics of the apparatus. The optical characteristic or characteristics can be adjusted in this manner.

The optical characteristics referred to here may include axial astigmatism, curvature of image field, magnification and distortion, for example. When plural sets of paired aspherical surface members such as described above and having their relative position made variable, are used in combination, different optical characteristics can be changed such that adjustment of different optical characteristics may be assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
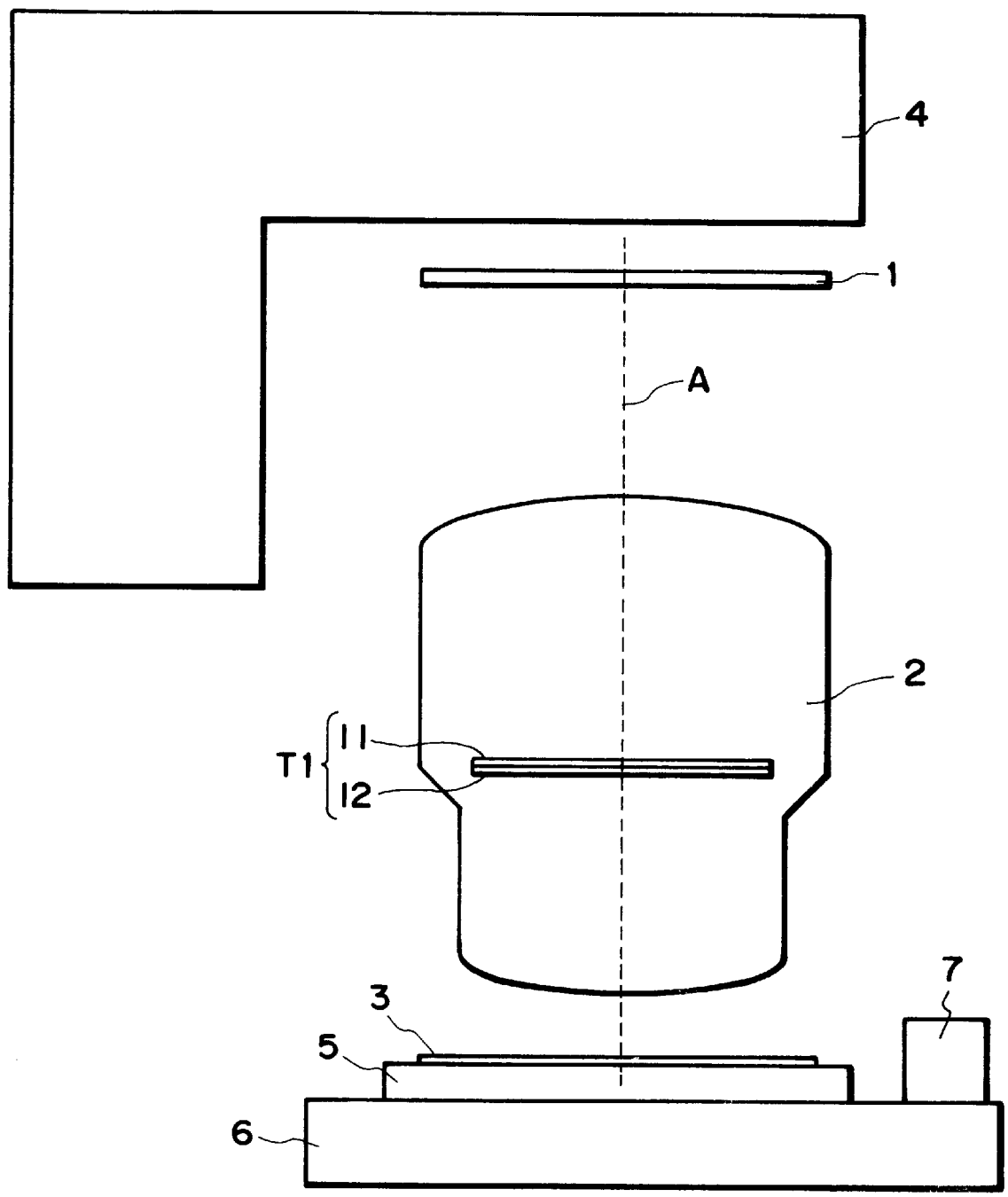
FIG. 1 is a schematic view of a main portion of a projection exposure apparatus according to a first embodiment of the present invention.

FIG. 1 is a schematic view of a main portion of a projection exposure apparatus according to a first embodiment of the present invention. In this embodiment, the invention is applied to a projection exposure apparatus of an ordinary stepper type or a scan type.

Denoted in the drawing at 4 is an exposure illumination system for illuminating a first object 1 having a pattern to be projected onto a second object. The exposure illumination system 4 may comprise an ArF excimer laser (193 nm wavelength) or a KrF excimer laser (248 nm wavelength), or alternatively, it may comprise a lamp that provides light of g-line (436 nm wavelength) or i-line (365 nm wavelength). Also, the illumination system may comprise a known optical system.

Denoted at 1 is a reticle or mask as the first object. Denoted at 2 is a projection optical system of refraction type or of a catadioptric system. It serves to project a circuit pattern of the reticle 1, as illuminated by the exposure illumination system 4, onto a wafer (second object) 3, which is the substrate to be exposed.

Denoted at T1 is optical means having a function for controlling axial astigmatism. It includes two optical elements 11 and 12 having aspherical surfaces and being made of silica or fluorite, to be described later. The optical means T1 is disposed adjacent to a pupil of the projection optical system 2. Denoted at 5 is a wafer holder for holding the wafer 3, and denoted at 6 is a wafer stage on which the wafer holder 5 is mounted. The wafer stage 6 produces X, Y and Z drives as well as θ drive and tilt drive, for example, as is known in the art.

Denoted at 7 is an interference mirror and it is used for monitoring the position of the wafer stage 7 through an interferometer (not shown). On the basis of signals produced by the combination of the interference mirror 7 and the interferometer, not shown, a wafer stage drive control system (not shown) controls positioning of the wafer 3 so that it is placed at a predetermined position. Then, a projection exposure process is performed.

In this embodiment, the optical means T1 and the projection optical system 2 are components of a projection system for projecting the pattern of the mask 1 onto the substrate 3, and this will apply to the other embodiments to be described later.

When the embodiment is applied to a scan type stepper (projection exposure apparatus), a reticle stage (not shown) on which the reticle 1 is placed as well as the wafer stage 6 are moved in a direction perpendicular to the optical axis of the projection optical system 2, at a mutual speed ratio corresponding to the imaging magnification of the projection optical system 2, whereby scan exposure is performed.

The stepper of this embodiment differs from a conventional stepper or scan type stepper in the point that the optical means T1 and driving means therefor (not shown) are provided along the projection light path. The remaining portion has essentially the same structure.

Generally, in a projection optical system having an ArF excimer laser (193 nm wavelength) as an exposure light source, since the wavelength of light from the ArF excimer laser is within a short wavelength region, selection of a usable glass material is limited. Currently, only silica ($SiO_2$) and fluorite ($CaF_2$) are usable.

However, for such a short wavelength region, even silica raises a problem in the point of transmissivity. It absorbs exposure light, causing a thermal change (change in optical characteristic) and thus a change in imaging performance. The situation may be similar to a case where thermal change is caused by use of i-line (365 nm wavelength) as exposure light. Although several types of glass materials are usable for correction of chromatic aberration in the case of i-line, such glass materials include low-transmissivity materials.

For the reason above, a problem of thermal aberration may be raised even in the case of i-line. For a projection optical system using an ArF excimer laser, however, the situation is strict because of a decrease of depth of focus attributable to miniaturization of a pattern.

A glass material of a projection system may cause aberration changes in response to absorption of exposure light. Among these aberrations to be produced here, one of the aberrations which is difficult to be corrected is axial astigmatism which is aberration of a revolutionally asymmetric component. Such axial astigmatism may be produced as a result of the passage of light through the projection system being revolutionally asymmetric. Such revolutional asymmetry to the projection system may be emphasized when, in the case of a scanning optical system, the sectional shape of illumination light has an elongated slit-like shape so that light of a slit-like shape enters the projection optical system 2.

Generally, the length of a slit along its lengthwise direction and the length (width) thereof along its widthwise direction are at a ratio of about 5, and within the projection system there is a revolutionally asymmetrical distribution (thermal distribution) which is emphasized as compared with the case of a stepper. Aberrations resulting from this include axial astigmatism produced on the axis and off the axis.

Generally, optical systems are designed on an assumption that the optical characteristics are symmetrical (revolutionally symmetrical) with respect to the optical axis. Thus, it is beyond prediction that the optical characteristic changes revolutionally asymmetrically due to absorption of exposure light and its effect applies up to an axial portion.

According to the inventors of the present invention, it has been found that axial astigmatism due to exposure is produced largely in the initial stage and that, with the repetition of an exposure process, the amount of astigmatism becomes smaller due to diffusion of heat absorbed.

Typically, in a projection system for semiconductor device manufacture, the amount of axial astigmatism to be produced by absorption of exposure light by a glass material is small. However, with decreasing depth of focus in relation to further miniaturization of a pattern (decreasing linewidth to a half micron or quarter micron order), it cannot be disregarded.

The inventors have found that, because the amount of axial astigmatism is of a small order of 0.2 to 0.3 micron, it can be corrected by introducing a transmission type optical element with a unique function.

In a specific structure of a projection system according to this embodiment of the present invention, one or more optical means each comprising at least a pair of optical elements having aspherical surfaces are disposed along the light path of a projection optical system, in the manner that the aspherical surfaces of the optical elements are disposed opposed to each other. The paired optical elements may be laterally shifted in a direction perpendicular to the optical axis, such that their relative position with respect to the perpendicular direction is changed, to thereby adjust and correct the axial astigmatism. The optical means comprising two optical elements with aspherical surfaces serves to produce a revolutionally asymmetric power in accordance with the amount of shift, and this enables changing and correction of axial astigmatism of the projection optical system.

In this embodiment, a particular note has been paid to the fact that the amount of axial astigmatism resulting from absorption of exposure light is small, and effective correction is made by use of optical means having only a small aspherical amount. Further, since the absolute value of aspherical amount of the optical means of this embodiment is small, only the axial astigmatism can be corrected without adversely affecting the other optical characteristics. In this respect, it is good aberration correcting means.

A specific structure of optical means according to this embodiment, for correction of axial astigmatism, will now be explained. The optical means of this embodiment has a feature that it uses paired (two in a pair) optical elements and, when two optical elements are considered as a unit, they are so arranged that a small power is produced and also that the power can be changed finely.

The projection exposure apparatus according to the first embodiment of the present invention, as illustrated in FIG. 1, uses such optical means as described, to thereby correct axial astigmatism of the projection optical system.

Figure 2:
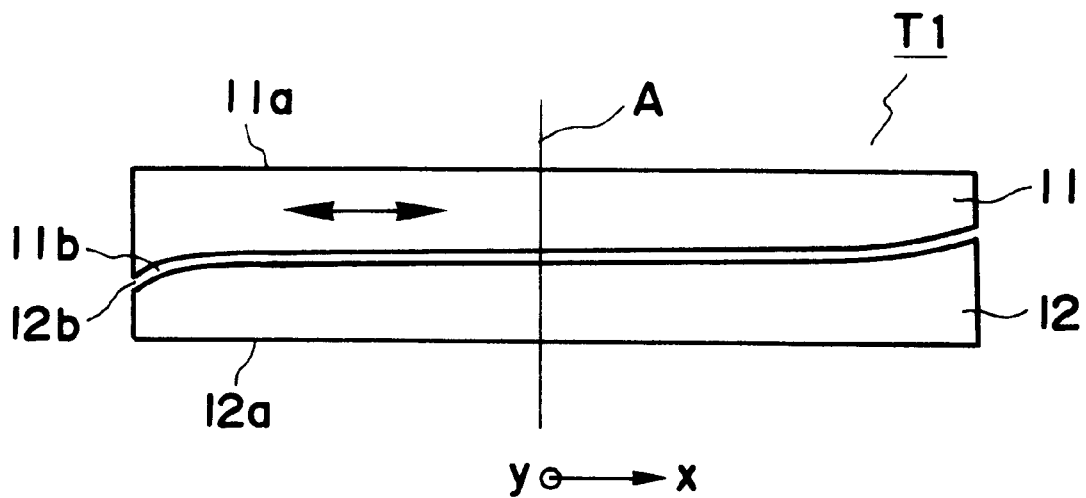
FIG. 2 is an enlarged view of a portion of FIG. 1.

Next, the structure of optical means T1 used in the first embodiment of FIG. 1 will be explained. FIG. 2 is a sectional view of a main portion of the optical means T1 having a function for controlling axial astigmatism, according to the present embodiment.

In FIG. 2, two optical elements 11 and 12 disposed opposed to each other have flat outside faces 11a and 12a. The opposed surfaces 11b and 12b of them are aspherical surfaces of the same shape. They are opposed to each other so that, when they are contacted face to face, these surfaces contact intimately with each other. However, the surfaces 11b and 12b may be aspherical surfaces of different shapes.

Denoted in FIG. 2 at A is an optical axis. Here, X and Y axes are taken so that they extend perpendicularly to the optical axis, and the aspherical surface of the optical element 11 is denoted by $fa(x, y)$ while the aspherical surface of the optical element 12, opposed to the optical element 11, is denoted by $fb(x, y)$. If the direction of shift is the X direction, the aspherical surface shapes of them are given by the following equations which are different in the constant term, that is:

$$fa(x, y)=ax^3+bx^2+cx+d_1$$

$$fb(x, y)=ax^3+bx^2+cx+d_2 \quad (1a)$$

The reason that the above equations concern x only is that the relative position of the two optical elements 11 and 12 is changeable only with respect to the X direction to control an optical power (focal length) only in the X direction. Since optical power is produced by a lateral shift of the elements in the X direction, terms up to cubic or third order are used for x.

In the initial stage, the aspherical surface shape $fa(x, y)$ of the optical element 11 and the aspherical surface shape $fb(x, y)$ of the optical element 12 can be completely fitted to each other and, therefore, the optical means T1 comprising the optical elements 11 and 12 has no optical power and it functions merely as a parallel flat plate. The spacing between the optical elements 11 and 12 in the optical axis A direction may preferably be made small as much as possible, and typically it may be about 100 microns. Here, a case where the optical element 11 is shifted in the X direction by a distance $\Delta$ is considered. The influences produced here are, if a, b and c are constants, as follows:

$$fa(x+\Delta, y)-fb(x, y)=3a\Delta x^2+2b\Delta x+c\Delta+(d_1-d_2)+3a\Delta^2+b\Delta^2+a\Delta^3 \quad (2a)$$

Here, a higher order term of $\Delta$ may be disregarded because the effect of it is small, and for a better understanding of the effect of the embodiment, it is assumed that:

$$b=c=0 \quad (3a)$$

As a result, equation (2a) can be simplified and it can be rewritten as equation (4a) below:

$$fa(x+\Delta, y)-fb(x, y)=3a\Delta x^2+(d_1-d_2) \quad (4a)$$

It is important in this embodiment that equation (4a) includes a term $x^2$. Thus, as a result of a lateral shift of amount $\Delta$, the optical elements 11 and 12 provide an optical system having an optical power only in the X direction and, additionally, the power can be changed as desired with the amount of lateral shift $\Delta$.

The procedure of producing a lateral shift to provide a deviation, just corresponds to differentiation. For this reason, a third order term is included as the shape of the aspherical surface, and a second order component that provides optical power due to the effect of differentiation is set. This is the function of the optical elements 11 and 12.

While in this embodiment a relation b=c=0 is assumed in equation (3a) for simplicity, the term $2b\Delta x$ in equation (2a) corresponds to the amount of shift. Since the amount $\Delta$ is given or known for the purpose of power control, correction can be made with regard to the shift amount $\Delta$. The case where the shifting raises a problem specifically if $b \neq 0$, is concerned with alignment procedure. For a global alignment procedure, such a problem may be solved by controlling the stage so that the shift, which is to be caused by changing the relative position of the paired optical elements such as elements 11 and 12, is inversely corrected.

Further, when a suitable value is given to the term of constant c, there is an advantage that the absolute values of deviations, with respect to a flat plane, of aspherical surfaces as represented by $fa(x, y)$ and $fb(x, y)$ can be made smaller. Therefore, depending on the value of constant a, the constants b and c may not be set to zero and, rather, certain values may be given to them. Practically, the constant b may be set to zero, while a value of opposite sign to constant a may be given to constant c.

However, as regards correction based on the value c, since practically it can be corrected with the tilt of incidence light during measurement through the interferometer, there is no problem even if c=0 is set.

Generally, the absolute value of an aspherical amount required for correcting a small value astigmatism of about 0.2 to 0.3 micron, is very small. While it depends on the positions of optical elements 11 and 12 placed, in practice the effective amount may be a number of several in terms of Newton's fringes. As a typical example, if the amount to be produced as a power component is 1 micron and the lens diameter is 200 mm and the shift amount $\Delta$ is 5 mm, then, from equation (4a), it follows that:

$$3a \times 5 \times 100 \ 100=0.001.$$

Therefore, $$a=6.7 \times 10^{-9}$$

is obtained.

The value 100 shows the radius (the diameter is 200 mm). If b=c=0, the aspherical amount with equation (1a) will be:

$$6.7 \times 10^{-9} \times 100 \times 100 \times 100 = 6.7 \times 10^{-3}.$$

This means that the optical elements 11 and 12 have an aspherical amount of ±6.7 microns.

In order to reduce the amount of actual deviation from a flat plane, the term of constant c may be added to this. Since the value of constant c with which a value of 6.7 microns is determined in reference to 100 mm is $6.7 \times 10^{-5}$, the constants a and c may be set with opposite signs, and $$c=-6.7 \times 10^{-5}$$

may be set. Then, deviation of an aspherical amount from a flat plane can be reduced up to ±2.6 microns.

Figure 3:
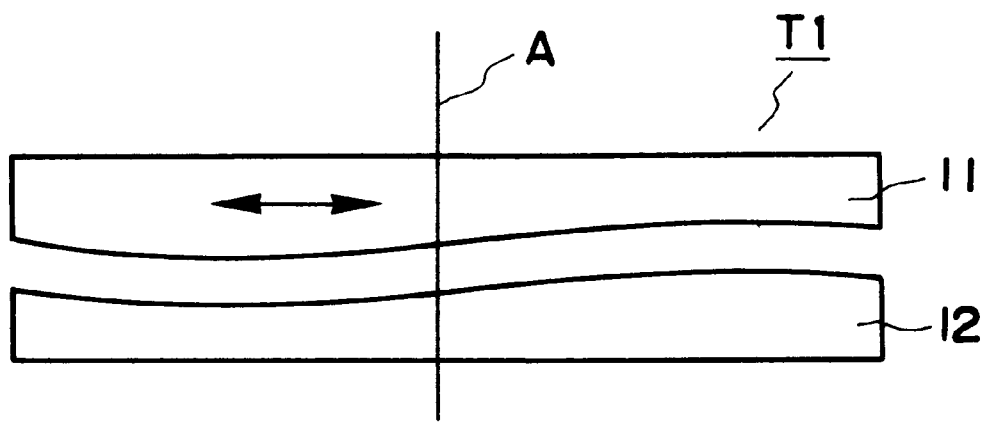
FIG. 3 is an enlarged view of a portion of FIG. 1.

FIG. 2 shows an aspherical surface shape when the constant c is zero, and FIG. 3 shows the shape along the section y=0 as the above-described value is substituted into constant c. Since within the range of diameter of 200 mm the aspherical surfaces have slowly changing shapes and, additionally, the optical elements 11 and 12 have mutually complementing shapes, production of other aberrations resulting from a change in relative position of the optical elements 11 and 12 can be suppressed to a small amount which can be disregarded. Thus, fine correction of axial astigmatism only is assured.

However, there may be cases wherein a very small change occurs in other optical characteristics such as focus or magnification, for example, which may desirably be corrected. In such a case, correction may be made with regard to these optical characteristics.

Correcting axial astigmatism by use of aspherical surface means and controlling it by continuously changing the aspherical surface amount, is a unique concept, and this embodiment of the present invention is contributable to improvement of the function of a projection exposure apparatus for the manufacture of semiconductor devices.

Further, since the amount of axial astigmatism to be controlled is small, the aspherical surface to be used can be made small as can be measured by use of an interferometer. This is another feature of the present invention.

Since in this embodiment a desired axial astigmatism can be produced on the basis of a deviation between two aspherical surfaces shifted laterally, the aspherical amount of the optical element 11 or 12 itself may be a value larger by one digit than the amount of lateral deviation. In the example described above, an aspherical amount of 6.7 microns is required to provide a value of 1 micron as the effect of lateral shift. With the optimization of tilt, in addition to this, the value can be reduced to +2.6 microns, which is within the range of high precision measurement of an interferometer. For the manufacture of an aspherical surface, it is important to check whether the surface is formed exactly into a desired shape, but with the precision as required in this embodiment, conventional techniques are applicable to obtain a desired result.

Also, further reduction of an aspherical amount is attainable by reducing the correction amount (reducing the dynamic range) or by enlarging the amount of shift.

Further, in this embodiment, correction of asymmetrical optical power is attained by use of an optical element having a refracting function. Thus, the present embodiment provides a large advantage to both a refraction type and catadioptric type which are employed in a projection exposure apparatus.

The direction in which axial astigmatism is produced has an intimate relation with the directivity of the slit, in the case of a scan type stepper where exposure is performed with slit-like light. Thus, the X direction described, as having optical power to be controlled, is set so as to be registered with the lengthwise direction or widthwise direction of the slit. Practically, it may be set in registration with the direction of outside shape of the reticle 1, having a square shape as shown in FIG. 1.

This setting is effective also to aberration (exposure aberration) to be produced in an exposure process in a stepper. While this embodiment has been described with reference to a scan type stepper, for simplicity of explanation of axial astigmatism, there are cases wherein, in the use of ordinary steppers, if the pattern of a reticle has a directivity, diffraction light is distributed revolutionally asymmetrically, such that axial astigmatism is produced. From the characteristic of CAD in design of a circuit pattern, usually the circuit pattern of a reticle has an edge parallel to the outside shape of the reticle. If the X direction is set in parallel to the outside shape of the reticle, the direction in which exposure aberration is produced is registered with the X direction. Thus, production of aberration can be suppressed.

A driving mechanism which serves to change and adjust the positional relation of aspherical surfaces of the optical elements 11 and 12 may be actuated in accordance with the characteristic of axial astigmatism which may be stored beforehand in a central processing unit of the projection exposure apparatus. The drive amount (correction amount) may be calculated and controlled in accordance with the characteristic of axial astigmatism, having been stored in the apparatus on the basis of experiments or simulations, and by use of exposure amount, reticle pattern proportion, and exposure energy, for example. Alternatively, without calculation based on the characteristic of the system having been memorized, the drive amount may be controlled while monitoring the characteristic of the projection optical system. The amount of produced axial astigmatism has a correlation with focus change due to the exposure process, and, while monitoring the amount of focus change due to the exposure and converting it to the correction amount, the drive amount for the optical elements 11 and 12 may be calculated.

As a matter of course, the amount of axial astigmatism may directly be measured and the measured value may be fed back to the drive amount for changing the relative position of the optical elements 11 and 12.

Since the amount of produced axial astigmatism (exposure aberration) changes with time, the drive amount for the optical elements 11 and 12 may change with time.

Figure 4:
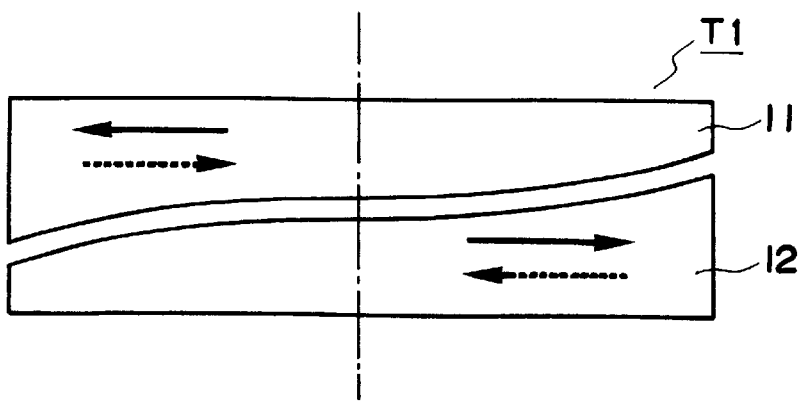
FIG. 4 is a schematic view of a modified form of a portion of FIG. 1.

While in this embodiment one of the optical elements is laterally shifted in the X direction, as an alternative, one may be moved by $\delta$ in the X direction and the other may be moved by $-\delta$ in the X direction. FIG. 4 shows such an example. That is, since $$fa(x+\delta, y)-fb(x-\delta, y)=2a(3\delta x^2+\delta^3)+4b\delta x+2c\delta+d_1-d_2,$$

like the foregoing example, $$b=c=0$$

is assumed and the effect of a higher order term of $\delta$ is disregarded. Then, $$fa(x+\delta, y)-fb(x-\delta, y)\approx 6ax^2\delta+d_1-d_2.$$

Thus, if the amount of shift is $\Delta=\delta$, the amount of power change becomes twice. Alternatively, for obtaining the same power change, the value of coefficient (constant) a can be halved. This leads to halving the aspherical surface amount and thus it facilitates evaluation of the shape. Further, the amount of shift can be halved, to obtain the same power change. This is very advantageous in space of the driving system or positioning precision.

Figure 5:
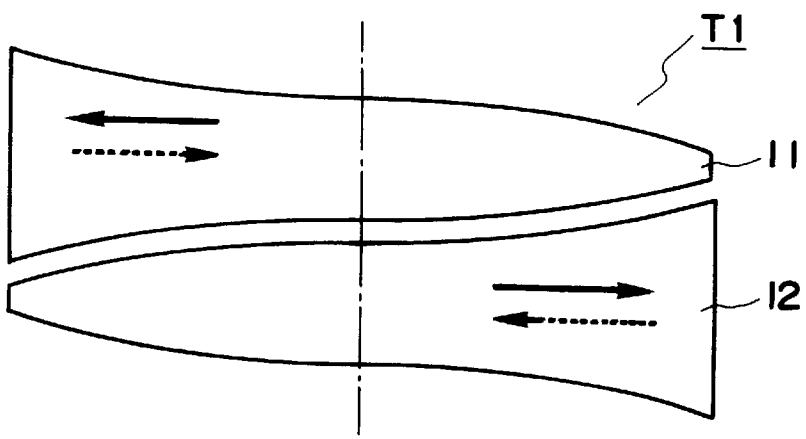
FIG. 5 is a schematic view of a modified form of a portion of FIG. 1.

While the present embodiment has been described with reference to a system where one surface of an optical element is aspherical, both surfaces of the optical element may be aspherical. FIG. 5 shows such an example. Here, if the thickness of the optical elements 11 and 12 is thin, the advantageous effects having been described above are accumulated simply. Therefore, if the aspherical surface has the same shape, the value of coefficient a can be reduced to a half, to obtain the same change in optical power. Also, only one optical element may be moved or, alternatively, both of the optical elements may be moved in opposite directions.

Figure 6:
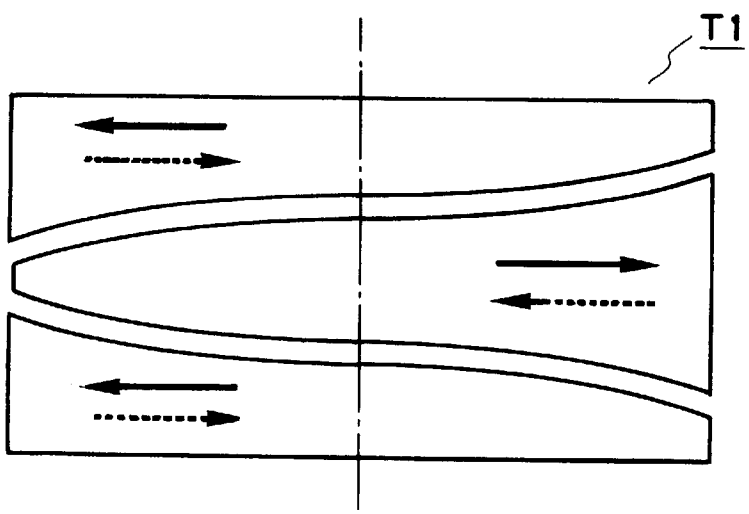
FIG. 6 is a schematic view of a modified form of a portion of FIG. 1.

Plural sets of paired optical elements may be used, with similar advantageous effects. FIG. 6 shows such an example.

Figure 7:
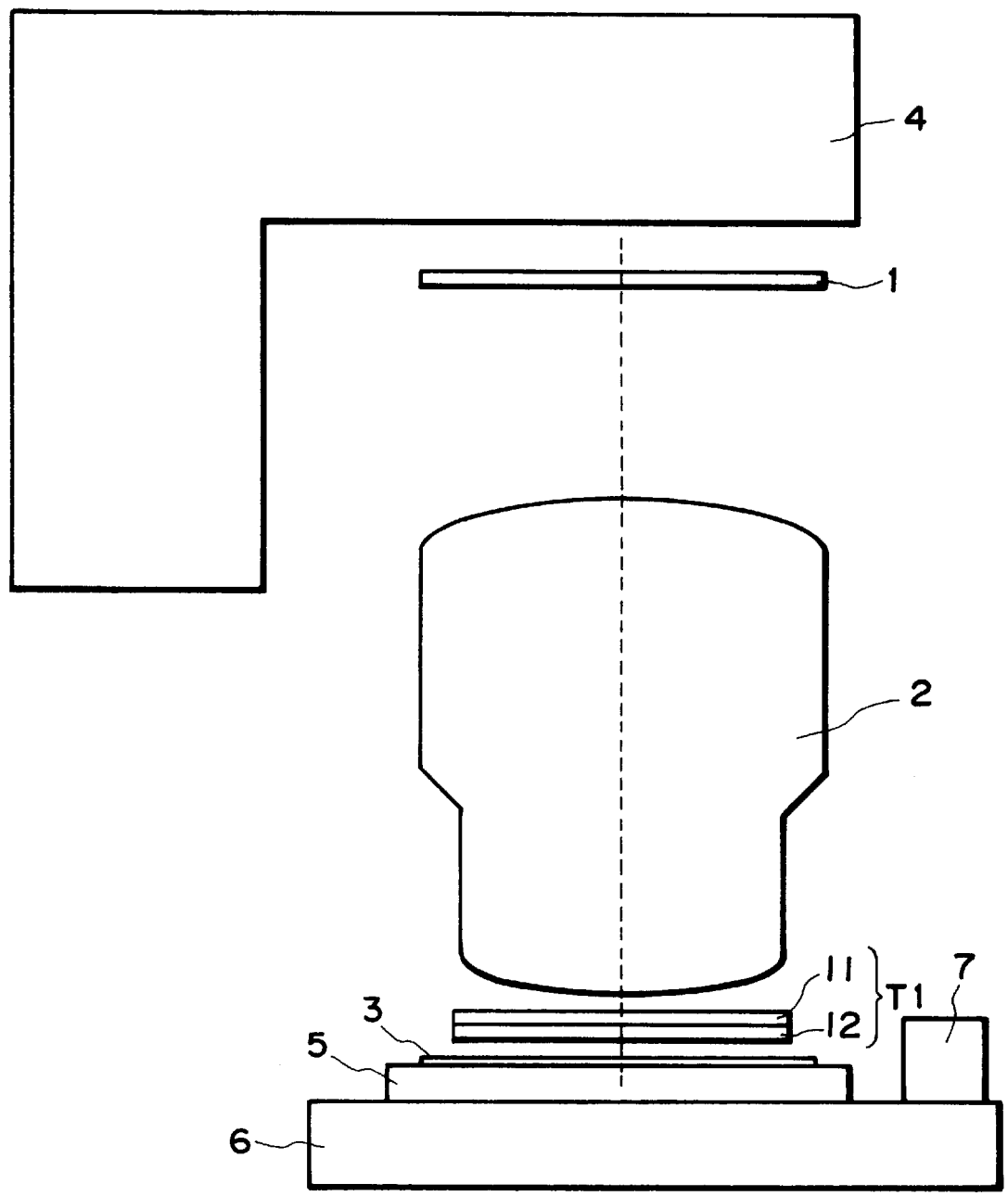
FIG. 7 is a schematic view of a main portion of a projection exposure apparatus according to a second embodiment of the present invention.

FIG. 7 is a schematic view of a main portion of a second embodiment of the present invention. In this embodiment, the optical means T1 is disposed along the light path between the projection optical system 2 and the wafer 3. Thus, the position of insertion of the optical means T1 to the light path differs from the first embodiment of FIG. 1. The remaining portion has substantially the same structure.

In this embodiment, a combination of optical elements having aspherical surfaces as having been described hereinbefore is interposed between the projection optical system 2 and the wafer 3 and, with a lateral shift of them, axial astigmatism is corrected. The function of the optical elements is essentially the same as that of the first embodiment, but the optical means used in this embodiment may be disposed at a suitable position other than a position adjacent to the pupil of the projection optical system 2.

The optical means T1 may preferably be disposed at one of a position adjacent to the pupil plane of the projection optical system 2, a position between the projection optical system 2 and the wafer 3 and a position between the projection optical system 2 and the reticle 1, because at these positions the independence of aberration control is relatively high which is preferable to control. However, the optical means may be disposed at any location other than them.

Figure 8:
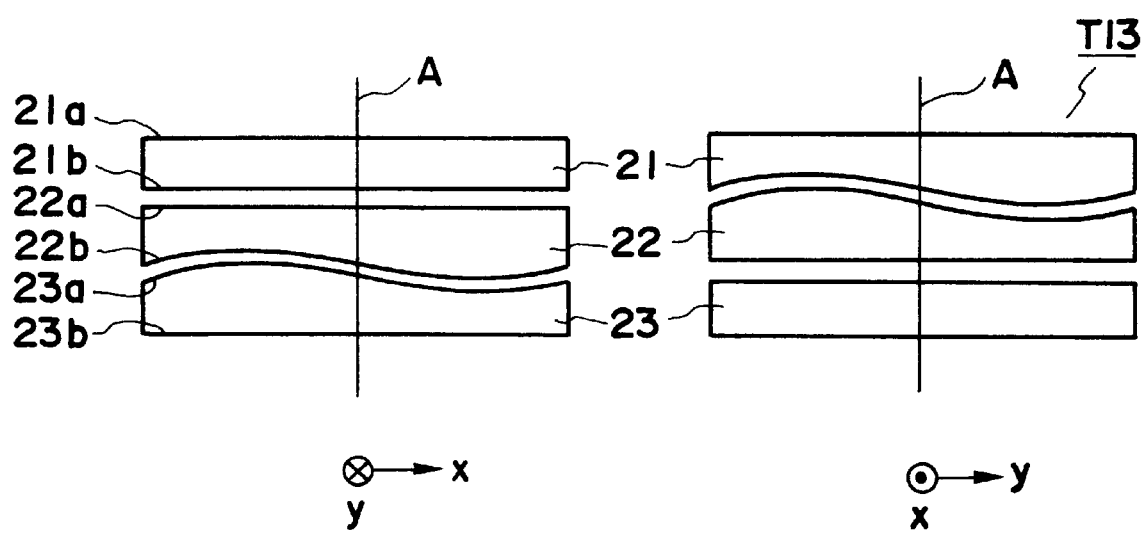
FIG. 8 is a schematic view of optical means which may be used in a projection exposure apparatus according to a third embodiment of the present invention.

FIG. 8 is a schematic view of a main portion of optical means T13 which can be used in a projection exposure apparatus according to a third embodiment of the present invention, wherein the optical means is illustrated in sections along X and Y directions. Except for the optical means T13, the projection exposure apparatus of this embodiment has essentially the same structure as that of the embodiment shown in FIG. 1 or 7.

The optical means T13 of this embodiment has three optical elements 21, 22 and 23. In the embodiments described above, correction of optical power only in one direction is performed, since the direction in which astigmatism is produced has a relation to the lengthwise direction of a slit or to the scan direction. However, there are cases where not only production of axial astigmatism but also production of curvature of image field cannot be disregarded. The present embodiment meets such a case.

The optical means T13 shown in FIG. 8 has the same optical power changing function not only with respect to the X direction but also with respect to the Y direction perpendicular to the X direction. The optical powers in these X and Y directions can be controlled independently from each other, and by this, both axial astigmatism and curvature of image field can be corrected.

In FIG. 8, the top surface 21a of the optical element 21 is flat, while the bottom surface 21b of the optical element 21 and the top surface of the optical element 22 are aspherical surfaces opposed to each other. By mutually shifting them in the Y direction, the optical power in the Y direction can be provided and thus changed. The principle of Y-direction optical power control is the same as having been described with reference to equations (1a) to (4a), with the parameter x being replaced by y. In this example, a reticle and a projection optical system are above the optical element 21, as viewed in the drawing, and a wafer is disposed below.

Further, the bottom surface 22b of the optical element 22 and the top surface 23a of the optical element 23 are spherical surfaces disposed opposed to each other. By mutually shifting them in the X direction, the optical power in the X direction is provided. The principle of X-direction optical power control is essentially the same as having been explained with reference to equations (1a)–(4a). The bottom face 23b of the optical element 23 is flat. Two types of spherical surfaces constituting the optical elements 21 and 22 (or the optical elements 22 and 23) may have the same parameters a, b and c, or different parameters. The amount of shift may be controlled in accordance with equation (2a) for calculation of power.

With the arrangement such as shown in FIG. 8, optical powers in the X and Y directions can be controlled independently. When optical powers to be produced in the X and Y directions are of the same amount, the curvature of image field is corrected. When they are of different amounts, curvature of image field and axial astigmatism are corrected. When the optical power in only one of the X and Y directions is produced, the axial astigmatism is corrected.

In the example of FIG. 8, the top surface 22a of the optical element 22 is used for the control in the Y direction while the bottom surface 22b thereof is used for the control in the X direction. However, the optical element 22 may be divided into two, that is, upper and lower components, such that the X-direction control and Y-direction control may be separated completely. As regards drive control of the relative positional relationship of the optical elements 21–23, it may be made essentially in the same way as has been explained. It may be made on the basis of calculation from the characteristic of the system having been memorized beforehand, or of calculation based on actually measured data. Although the manner of driving is slightly complicated because the subject of control is changed from one-dimensional to two-dimensional, the principle is fundamentally the same and duplicate explanation will be omitted here.

In the first to third embodiments described above, when correction of axial astigmatism or curvature of image field is made, the set value of best focus may change very slightly. Since, however, the amount of such change may be calculated or determined on the basis of the amount of drive of the aspherical surface optical element, the amount of focus change may be reflected within the CPU of the projection exposure apparatus to the control of the wafer surface position with respect to the optical axis direction. As regards other optical performance such as magnification, the influence to such optical performance can also be calculated on the basis of the amount of drive of the aspherical surface, similarly. Thus, it can be corrected easily.

When axial astigmatism is produced, asymmetrical magnification error may be produced. However, such revolutionally asymmetrical magnification (a difference in magnification between the scan direction and the slit lengthwise direction) can be corrected easily in a scan type stepper, and it does not raise a problem.

Further, in an ordinary stepper, a correcting function for asymmetric magnification, to be described later, may be added.

Figure 9:
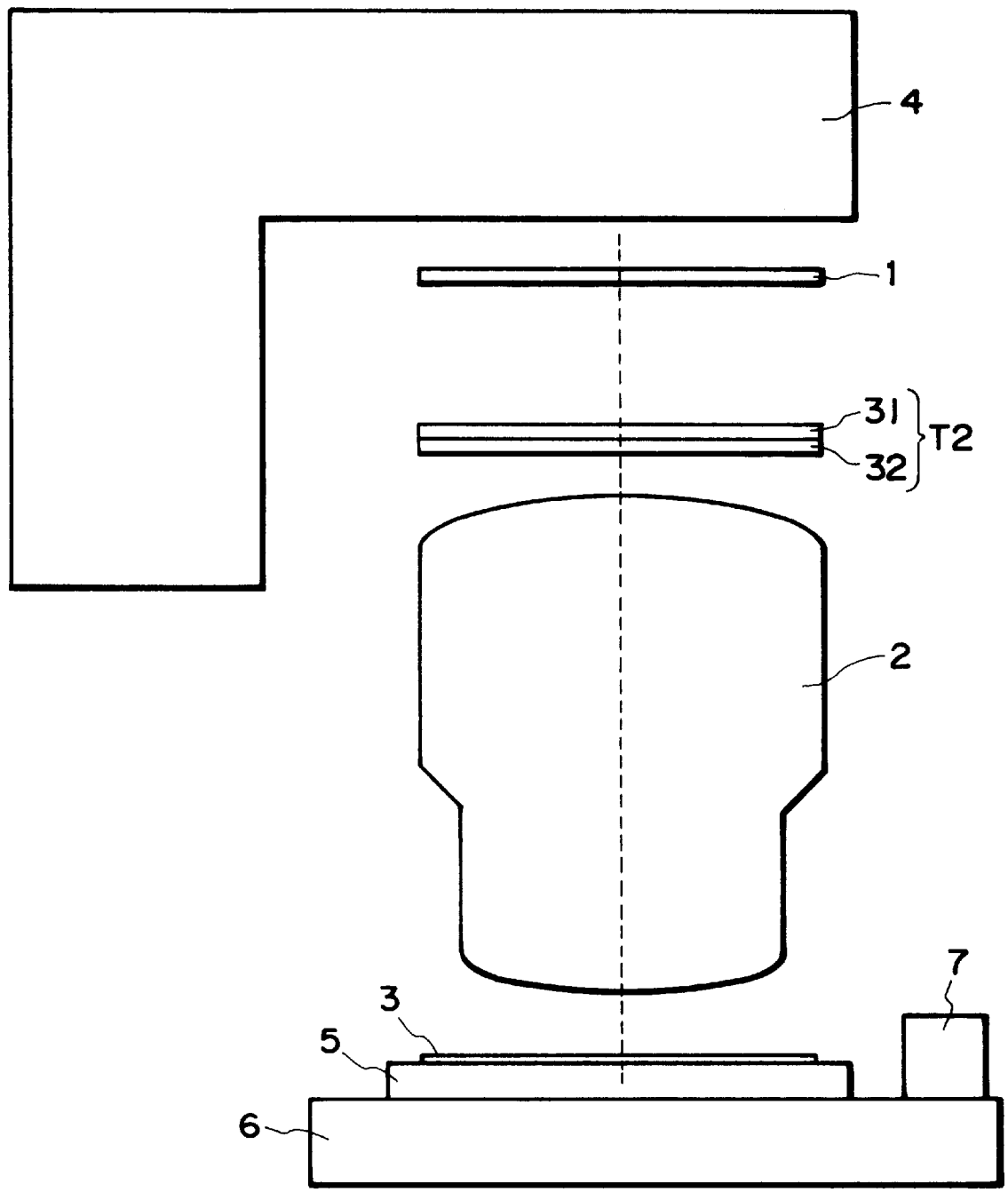
FIG. 9 is a schematic view of a main portion of a projection exposure apparatus according to a fourth embodiment of the present invention.

FIG. 9 is a schematic view of a main portion of a projection exposure apparatus according to a fourth embodiment of the present invention. In this embodiment, the invention can be applied to an ordinary type stepper or a scan type stepper.

Denoted in the drawing at 4 is an exposure illumination system for illuminating a first object 1. The exposure illumination system 4 may comprise an ArF excimer laser (193 nm wavelength) or a KrF excimer laser (248 nm wavelength), or alternatively, it may comprise a lamp that provides light of g-line (436 nm wavelength) or i-line (365 nm wavelength). Also, the illumination system may comprise a known optical system.

Denoted at 1 is a reticle as the first object. Denoted at 2 is a projection optical system of a refraction type or of a catadioptric system. It serves to project a circuit pattern of the reticle 1, as illuminated by the exposure illumination system 4, onto a wafer (second object) 3 which is the substrate to be exposed.

Denoted at T2 is optical means having a function for controlling magnification which is symmetrical or revolutionally asymmetrical with respect to the optical axis. It includes two optical elements 31 and 32 having aspherical surfaces, to be described later. The optical means T2 is disposed along the light path between the reticle 1 and the projection optical system 2. Denoted at 5 is a wafer holder for holding the wafer 3, and denoted at 6 is a wafer stage on which the wafer holder 5 is mounted. The wafer stage 6 produces X, Y and Z drives as well as θ drive and tilt drive, for example.

Denoted at 7 is an interference mirror and it is used for monitoring the position of the wafer stage 7 through an interferometer (not shown). On the basis of signals produced by the combination of the interference mirror 7 and the interferometer, not shown, a wafer stage drive control system (not shown) controls positioning of the wafer 3 so that it is placed at a predetermined position. Then, a projection exposure process is performed.

When the embodiment is applied to a scan type stepper, a reticle stage (not shown) on which the reticle 1 is placed as well as the wafer stage 6 are moved in a direction perpendicular to the optical axis of the projection optical system 2, at a mutual speed ratio corresponding to the imaging magnification of the projection optical system 2, whereby scan exposure is performed.

The stepper of this embodiment differs from a conventional stepper or scan type stepper in the point that the optical means T2 is provided along the light path. The remaining portion has essentially the same structure.

Generally, for control of imaging magnification of a projection system, for example, there are a method in which an optical element within the projection system is displaced along the optical axis direction, and a method in which the pressure of a closed space in a portion of the projection system is controlled. Any of these methods may be applicable to this embodiment.

However, these methods are to control the magnification which is revolutionally symmetrical with respect to the optical axis. They do not function to correct anamorphic magnification, that is, to control magnifications with respect to two axes of X and Y (which are perpendicular to the optical axis and also which are orthogonal to each other), to different values.

It has been confirmed that, during practical manufacture of semiconductor devices, anamorphic magnification is produced in the wafer itself. For a complicated semiconductor device, the procedure includes wafer processes of over twenty, and, during such procedure, a high-temperature process such as film formation and diffusion are repeated. On the other hand, before such a high-temperature process, patterning through exposure is performed. A pattern to be formed in these processes for a semiconductor device are not necessarily isotropic. For example, for a lead wire process, it may comprise only linear patterns. Thus, a pattern may have a particular directivity.

Such directivity may attribute to the fact that the CAD in the design of a semiconductor device is based on X-Y coordinates, or that the semiconductor device itself needs repeated patterns such that the lines constituting the pattern are in a particular direction. Even if a product semiconductor device includes even numbers of linear elements extending in X and Y directions, during the processes intermediate of the manufacture, a significant directivity may appear. Elongation in the high-temperature process to be performed after the patterning shows, as a matter of course, a specific anisotropy according to the directivity of the pattern. This is the background of this embodiment of the present invention.

Elongation of a wafer with anisotropy may be determined by using an alignment detecting function of a position detecting sensor of a projection exposure apparatus. For detection of elongation, in the alignment process, a specific alignment mark having been provided on the wafer side may be read by using a position detecting sensor of the projection exposure apparatus.

For detection of anisotropy of a wafer, known alignment methods such as a global alignment method and die-by-die alignment method may be applied. For a global alignment process, a calculation procedure that elongation of a wafer as a whole corresponds to elongation of each shot, may preferably be used.

According to analyses made by the inventors, it has been found that the amount of anisotropy of a wafer actually produced by heat is very small. The average elongation of a wafer, that is, average elongation in X and Y directions reaches up to about 10 ppm. Among this, while it depends on the process, the proportion of anisotropy is about 10% to 20%, at the maximum, and it is about 2 ppm. Thus, in consideration of an optical system to be described later and of other error factors, for correction of asymmetrical magnification of the wafer itself, a value up to about 5 ppm has to be controlled.

The amount of an anisotropic elongation of about 2 ppm which induces an asymmetric component (magnification) of the wafer has not been considered as a problem. However, with enlargement of picture field size and miniaturization of linewidth, it becomes a problem.

Now, a specific structure of optical means for correcting anisotropy (elongation) of a wafer in this embodiment will be explained. In this embodiment, optical means having paired optical elements is used to produce, to the projection optical system, anisotropic imaging magnification which is revolutionally symmetric or revolutionally asymmetric.

The projection exposure apparatus of the fourth embodiment shown in FIG. 9 uses optical means T2 to correct the imaging magnification which is revolutionally asymmetric with respect to the optical axis. Particularly, in this embodiment, the optical means T2 having two optical elements with aspherical surfaces is interposed at a position of the projection optical system 2, closest to the reticle 1, or at a position equivalent to it. The positional relation of these optical elements with respect to a direction perpendicular to the optical axis is changed and adjusted, to thereby correct the magnification revolutionally asymmetric with respect to the optical axis.

Further, in this embodiment, two directions by which the magnification can be controlled independently are set in registration with X and Y directions which are used in CAD design of a semiconductor device pattern, by which control of the optical system matched to the asymmetrical variation of magnification, to be produced during practical semiconductor device manufacture, is facilitated.

Figure 10:
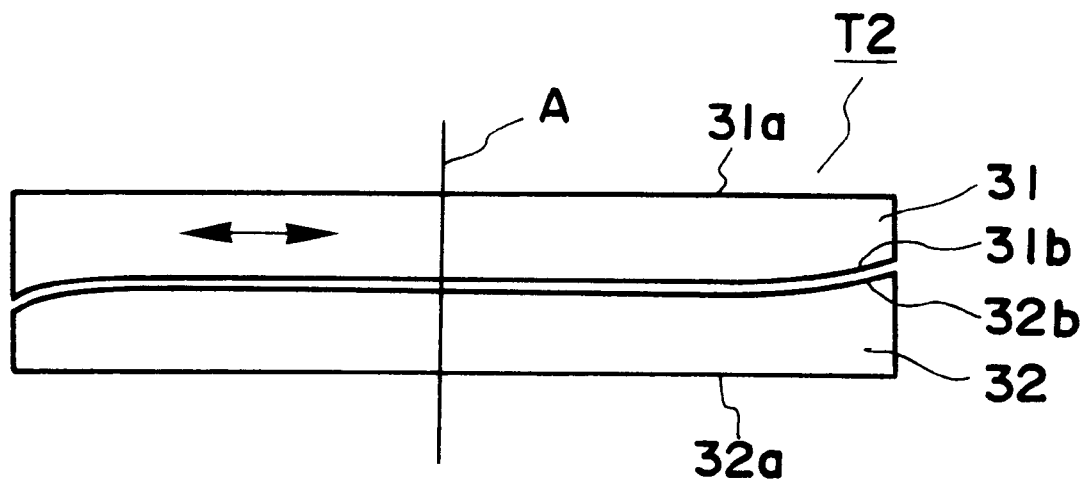
FIG. 10 is an enlarged view of a portion of FIG. 9.

The structure of optical means T2 of the fourth embodiment of FIG. 9 will be described. FIG. 10 is a schematic and sectional view of a main portion of the optical means T2, used in the fourth embodiment, and having a function for providing a desired magnification which is revolutionally asymmetric with respect to the optical axis. In the drawing, two optical elements 31 and 32 disposed opposed to each other have flat outside faces 31a and 32a, and their opposed faces 31b and 32b have the same aspherical shape so that, when the elements are in contact with each other, these faces can be intimately contacted with each other.

In the drawing, X and Y axes are taken to be perpendicular to the optical axis A, and the aspherical shape of the optical element 31 is denoted by fa(x, y) while the aspherical shape of the optical element 32 opposed to the element 31 is denoted by fb(x, y). Then, the aspherical shapes of these surfaces can be given by the same cubic equations such as follows, which are different only in the point of constant term. That is:

$$fa(x, y)=ax^3+bx^2+cx+d_1$$
$$fb(x, y)=ax^3+bx^2+cx+d_2. \quad (1b)$$

The reason that the equation (1b) does not include a term y is that the optical power (finite local length) is applied to the optical system only with respect to the X direction. The optical elements 31 and 32 are used to allow a shift of their relative position in the X direction, and, in order that such a lateral shift produces optical power in the optical means T2, as regards the aspherical shape the terms up to cubic or third order are used.

In the initial stage, the aspherical surface shape fa(x, y) and the aspherical surface shape fb(x, y) can be completely fitted to each other and, therefore, the optical means T2 comprising the optical elements 31 and 32 has no optical power and it functions merely as a parallel flat plate. The spacing between the optical elements 31 and 32 in the optical axis A direction may preferably be made small as much as possible, and typically it may be about 100 microns.

Here, a case where the optical element 31 is shifted in the X direction by a distance $\Delta$ is considered. The influences produced here are, if a, b and c are constants, as follows:

$$fa(x+\Delta, y)-fb(x, y)=3a\Delta x^2+2b\Delta x+c\Delta+(d1-d_2)+3a\Delta^2 x+b\Delta^2+a\Delta^3 \quad (2b)$$

Here, higher order term of $\Delta$ may be disregarded because the amount of shift is small, and it is assumed that:

$$b=c=0.$$

As a result, equation (2b) can be simplified and it follows that:

$$fa(x+\Delta, y)-fb(x, y)=3a\Delta x^2+(d_1-d_2) \quad (4b)$$

It is important in this embodiment that equation (4b) includes a term $x^2$. Thus, as a result of a lateral shift of amount $\Delta$, the optical elements 31 and 32 provide an optical system having optical power only in the X direction and, additionally, the power can be changed as desired with the amount of lateral shift $\Delta$.

The procedure of producing lateral shift to provide a deviation, just corresponds to differentiation. For this reason, a third order term is included for the shape of the aspherical surface, and a second order component that provides optical power due to the effect of differentiation is set. This is the function of the optical elements 31 and 32.

In this embodiment a relation b=c=0 is assumed in equation (3b), for simplicity. Also, the term $2b\Delta x$ in equation (2b) corresponds to the amount of shift. Since the amount $\Delta$ is given or known for the purpose of power control, correction can be made with regard to the shift amount $\Delta$. The case where the shifting raises a problem specifically if b≠0, is concerned with an alignment procedure. Such a problem may be solved by controlling the stage so that the shift, which is to be caused by changing the relative position of the paired optical elements 31 and 32, is inversely corrected.

Further, when a suitable value is given to the term of constant c, there is an advantage that the absolute values of deviations, with respect to a flat plane, of aspherical surfaces can be made smaller. Practically, the constant b may be set to zero to reduce the value of the aspherical amount, while a value of opposite sign to constant a may be given to constant c. Also, for the same reason as described, c=0 may be set.

Generally, the absolute value of the aspherical amount required for correcting a small value magnification of about 2 ppm, is very small. While it depends on the positions of optical elements 31 and 32 placed, in practice the effective amount may be a number of several in terms of Newton's fringes. As a typical example, if the amount to be produced as a power component is 1 micron and the lens diameter is 200 mm and the shift amount $\Delta$ is 5 mm, then, from equation (4b), it follows that:

$$3a \times 5 \times 100 \times 100 = 0.001.$$

Therefore, $$a=6.7 \times 10^{-9}$$

is obtained. The value 100 shows the radius (the diameter is 200 mm). If b=c=0, the aspherical amount with equation (1b) will be:

$$6.7 \times 10^{-9} \times 100 \times 100 \times 100 = 6.7 \times 10^{-3}.$$

This means that the optical elements 31 and 32 have an aspherical amount of ±6.7 microns.

In order to reduce the amount of actual deviation from a flat plane, the term of constant c may be added to this. Since the value of constant c with which a value of 6.7 microns is determined in reference to 100 mm is $6.7 \times 10^{-5}$, the constants a and c may be set with opposite signs, and $$c=-6.7 \times 10^{-5}$$

may be set. Then, a deviation of an aspherical amount from a flat plane can be reduced up to ±2.6 microns.

Figure 11:
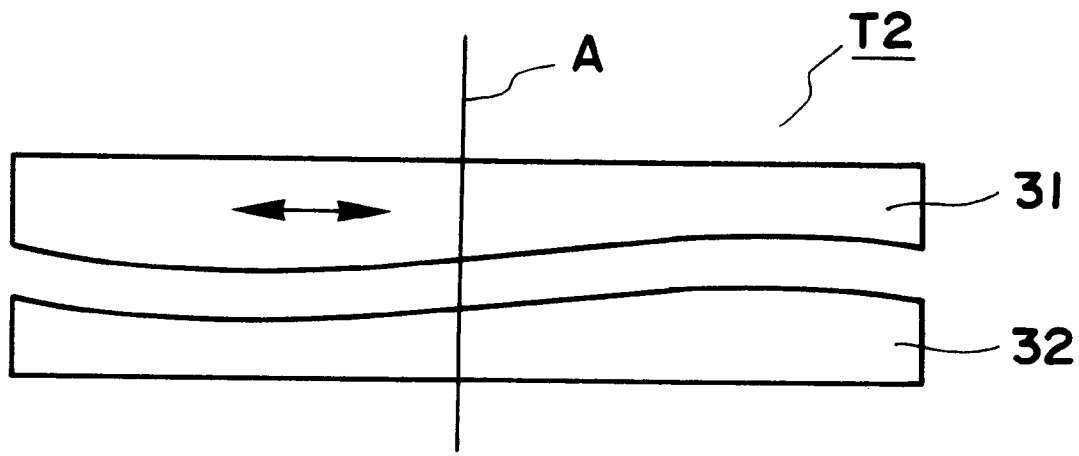
FIG. 11 is an enlarged view of a portion of FIG. 9.

FIG. 10 shows an aspherical surface shape when the constant c is zero, and FIG. 11 shows the shape as the above-described value is substituted into constant c. Since within the range of diameter of 200 mm the aspherical surfaces have slowly changing shapes and, additionally, the optical elements 31 and 32 have mutually complementing shapes, production of aberration resulting from a change in relative position of the optical elements 31 and 32 is not substantially influential to the other optical performance. Thus, fine correction of only the magnification is assured.

Figure 12:
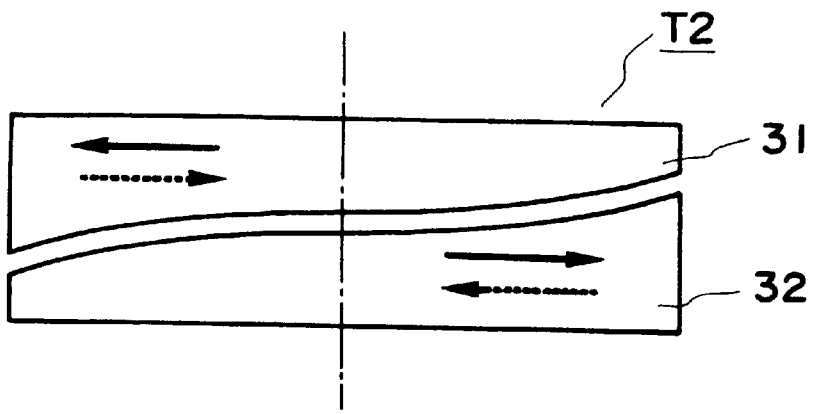
FIG. 12 is a schematic view of a modified form of a portion of FIG. 9.

While in this embodiment one of the optical elements is laterally shifted in the X direction, as an alternative, one may be moved by $\delta$ in the X direction and the other may be moved by $-\delta$ in the X direction. FIG. 12 shows such an example. That is, since $$fa(x+\delta, y)-fb(x-\delta, y)=2a(3\delta x^2+\delta^3)+4b\delta x+2c\delta+d_1-d_2,$$

like the foregoing example, $$b=c=0$$

is assumed and the effect of a higher order term of $\delta$ is disregarded. Then, $$fa(x+\delta, y)-fb(x-\delta, y)=6ax^2\delta+d_1-d_2.$$

Thus, if the amount of shift is $\Delta=\delta$, the amount of optical power change becomes twice. Alternatively, for obtaining the same power change, the value of coefficient (constant) a can be halved. This leads to halving the aspherical surface amount and thus it facilitates evaluation of shape. Further, the amount of shift can be halved, to obtain the same power change. This is very advantageous in space of the driving system or positioning precision.

Practically, in this embodiment, due to the effect that the relative deviation is doubled because of shifting in the positive and negative directions, the aspherical amount is reduced to a half.

Figure 13:
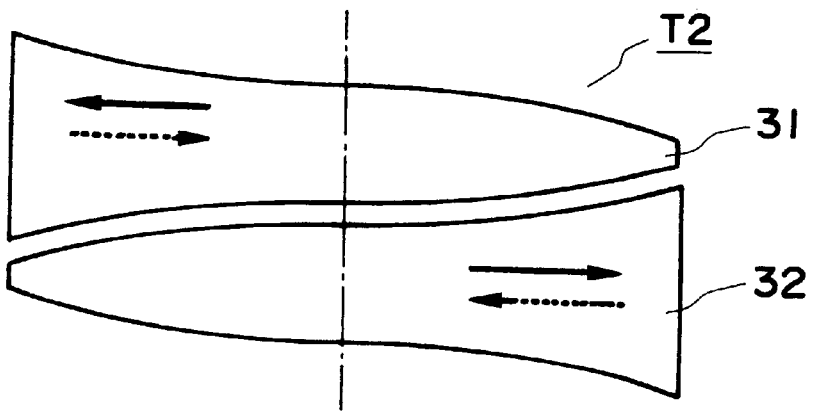
FIG. 13 is a schematic view of a modified form of a portion of FIG. 9.

The present embodiment has been described with reference to a system where one surface of an optical element is aspherical. However, both surfaces of the optical element may be aspherical. FIG. 13 shows such an example. Here, if the thickness of the optical elements 31 and 32 is thin, the advantageous effects having been described above are accumulated simply. Therefore, if the aspherical surface has the same shape, the value of coefficient a can be reduced to a half, to obtain the same change in optical power. Also, only one optical element may be moved or, alternatively, both of the optical elements may be moved in opposite directions.

Figure 14:
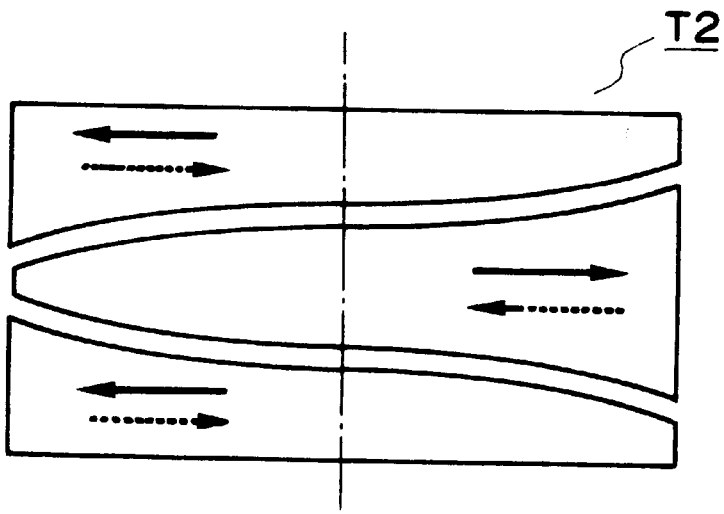
FIG. 14 is a schematic view of a modified form of a portion of FIG. 9.

Plural sets of paired optical elements may be used, with similar advantageous effects. FIG. 14 shows such an example.

The difference in magnification between X and Y directions may be attributable not only to the wafer process but also to distortion matching between different exposure apparatuses, distortion matching between different exposure modes, and an error in production of a reticle. The amount of asymmetrical (anisotropic) correction of magnification may be on an order of a few ppm. The amount of correction may be inputted into the exposure apparatus by an operator, for example, and parameters of data may be set. Then, the relative position of the optical elements 31 and 32 may be adjusted through a driving mechanism (not shown) and in accordance with the set parameters, whereby the setting of the apparatus is performed. The parameter setting may be done by direct input to the exposure apparatus, on the basis of automatic measurement.

Since CAD of circuit design of a semiconductor device is based on an X-Y coordinate system, the X and Y directions referred to in the above and perpendicular to the optical axis may preferably be set in registration with the X and Y directions of the CAD.

Generally, the X and Y directions correspond to the directions of end faces of a reticle. Thus, X and Y directions of the optical elements 31 and 32 correspond to the directions of end faces (longitudinal and lateral sides) of the reticle. These X and Y directions correspond to X and Y directions along which the stage 6 is movable, such that it meets to X magnification and Y magnification which are required in a global alignment procedure.

The intra-shot component in global alignment is corrected on an assumption that, as described, the wafer elongation corresponds to shot elongation. This assumption is based on the fact that the elongation rate of a wafer as a whole is constant within the wafer, that is, good linearity is maintained. It has been confirmed that a good correction result is attainable.

Practically, in global alignment, if elongation of s ppm in the X direction and t ppm in the Y direction is observed, the component t ppm may be corrected by symmetrical magnification correcting means of the projection optical system (known in the art), while the optical element 31 may be driven in relation to the X direction to correct (s−t) ppm. Alternatively, the component s ppm may be corrected by symmetrical magnification correcting means of the projection optical system while the optical element 31 may be moved in relation to the X direction to correct (t−s) ppm.

Revolutionally asymmetric magnification is controlled in this embodiment by using optical elements having aspherical surfaces and by changing the positions of the optical elements. Thus, when this embodiment is incorporated into a projection exposure apparatus, it contributes to improvement of the function of the apparatus.

Since in this embodiment a desired optical performance can be produced on the basis of a deviation between two aspherical surfaces shifted laterally, the aspherical amount of the optical element 31 or 32 itself may be a value larger by one digit than the amount of lateral deviation. In the example described above, an aspherical amount of 6.7 microns is required to provide a value of 1 micron as the effect of lateral shift. With the optimization of tilt, in addition to this, the value can be reduced to ±2.6 microns, which is within the range of high precision measurement of an interferometer. For manufacture of an aspherical surface, it is important to check whether the surface is formed exactly into a desired shape, but with the precision as required in this embodiment, conventional techniques are applicable to obtain a desired result.

The signal for driving the optical elements with aspherical surfaces may be applied in response to a measured value of a wafer, as described, or it may be supplied by an operator. In the latter case, a signal is promptly applied to the driving mechanism from a CPU which controls the exposure apparatus as a whole, to perform the correction. In the case of global alignment, after the measurement is done and a correction amount is calculated and before a start of an exposure operation, the signal is applied to the driving mechanism.

Figure 15:
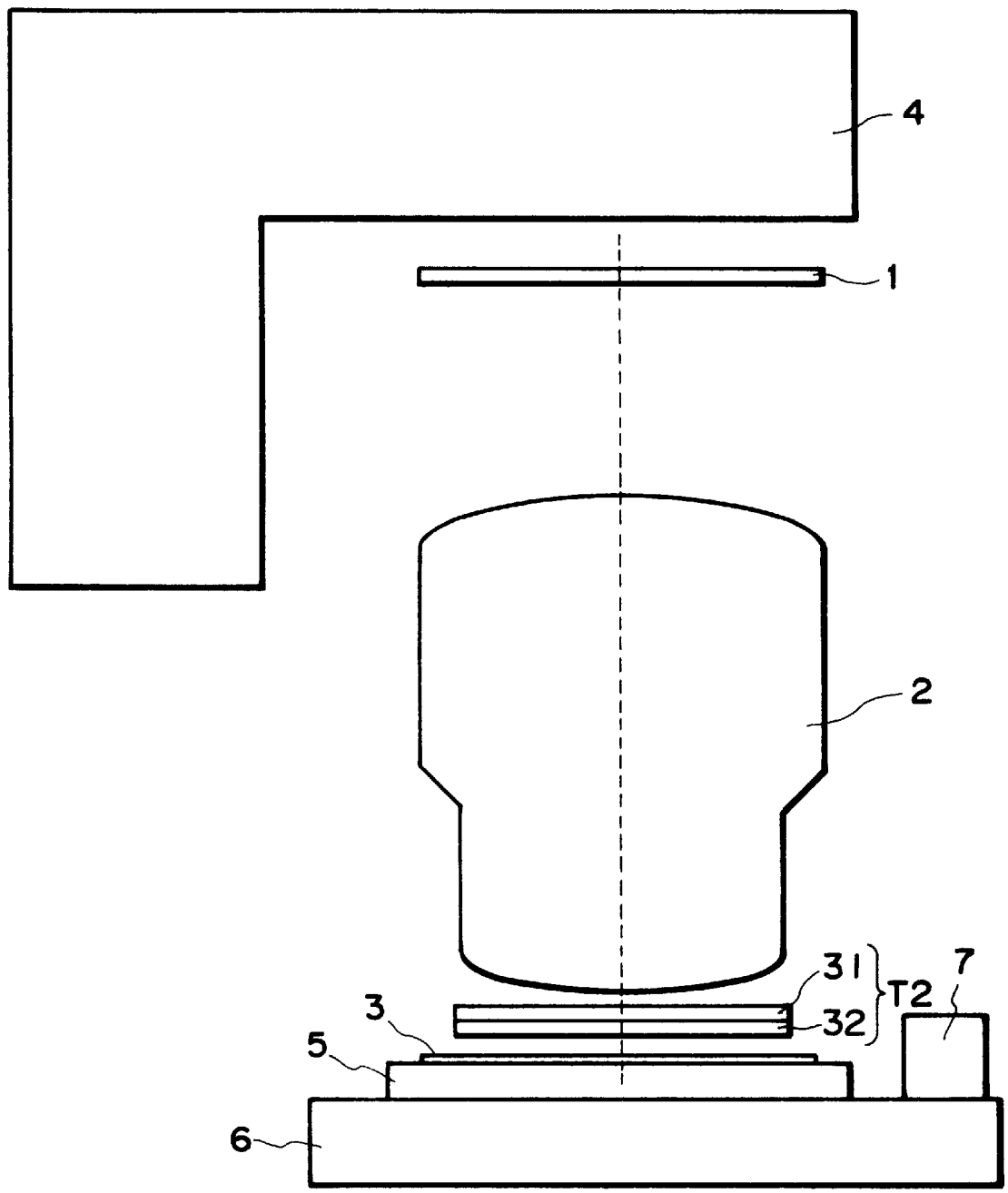
FIG. 15 is a schematic view of a main portion of a projection exposure apparatus according to a fifth embodiment of the present invention.

FIG. 15 is a schematic view of a main portion of a fifth embodiment of the present invention. In this embodiment, optical means T2 having a function for correcting magnification which is revolutionally asymmetric with respect to the optical axis is disposed along the light path between a projection optical system 2 and a wafer 3. As compared with the fourth embodiment of FIG. 9, the position of the optical means T2 interposed in the light path differs. The remaining portion has essentially the same structure.

While a pair of optical elements having an aspherical surface may be disposed at a desired position, there are cases wherein, depending on the position of insertion, the range of correction of magnification is limited. Thus, the position of insertion should be determined in consideration of it.

In the fourth and fifth embodiments described above, a magnification (component) which is revolutionally asymmetric with respect to the optical axis of the projection system, such as elongation resulting from a semiconductor process, distortion matching between different apparatuses, reticle production error, and the like, can be adjusted. Therefore, the overlay precision can be improved significantly.

Further, the amount of correction of magnification is variable and, thus, various changes can be met. Additionally, since the spherical surface amount is small, only the magnification can be controlled without applying substantial influence to the other optical performance.

Figure 16:
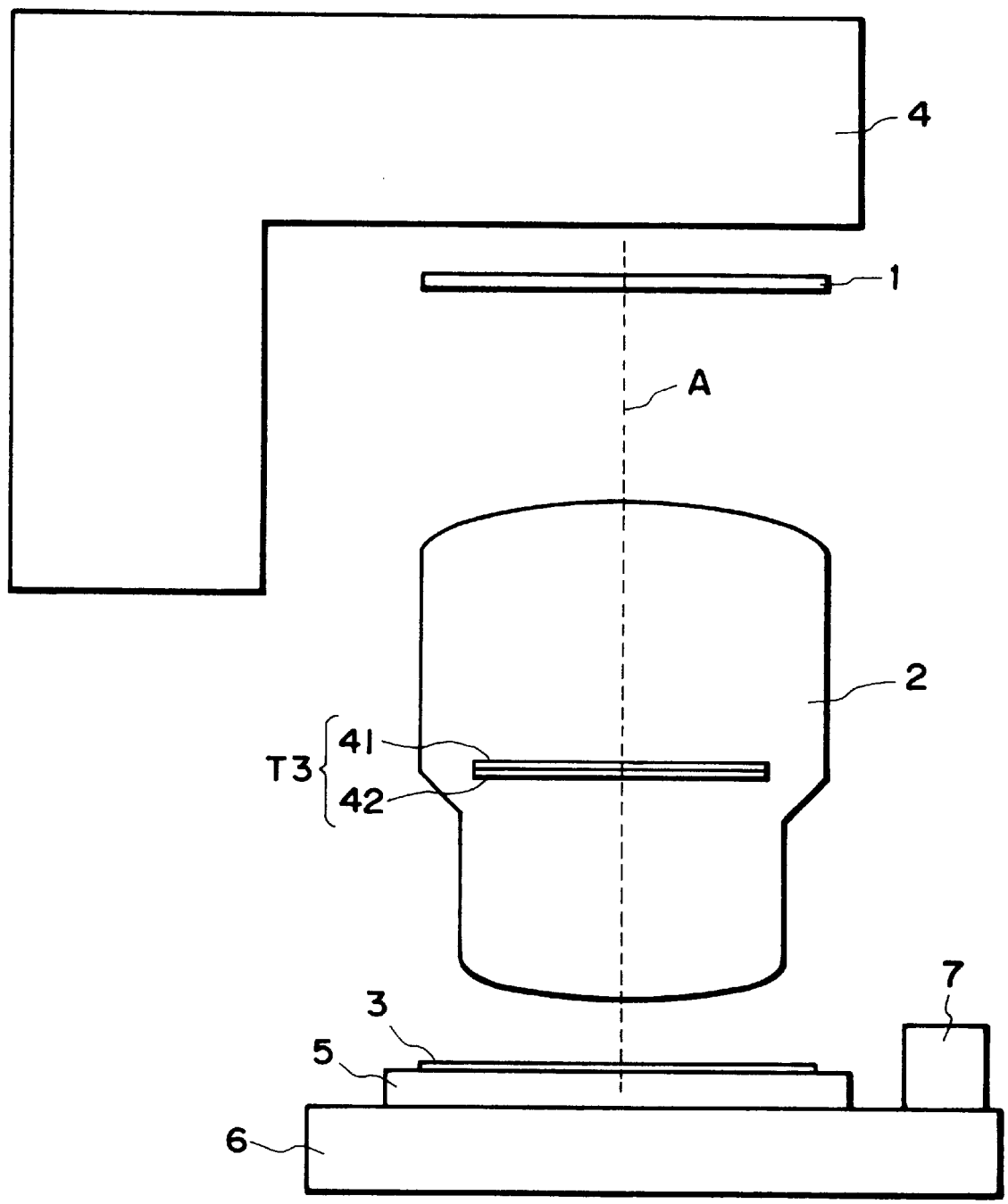
FIG. 16 is a schematic view of a main portion of a projection exposure apparatus according to a sixth embodiment of the present invention.

FIG. 16 is a schematic view of a main portion of a projection exposure apparatus according to a sixth embodiment of the present invention. In this embodiment, the invention is applied to a projection exposure apparatus of an ordinary stepper type or a scan type.

Denoted in the drawing at 4 is an exposure illumination system for illuminating a first object 1. The exposure illumination system 4 may comprise an ArF excimer laser (193 nm wavelength) or a KrF excimer laser (248 nm wavelength), or alternatively, it may comprise a lamp that provides light of g-line (436 nm wavelength) or i-line (365 nm wavelength). Also, the illumination system may comprise a known optical system.

Denoted at 1 is a reticle or mask as the first object. Denoted at 2 is a projection optical system of refraction type or of a catadioptric system. It serves to project a circuit pattern of the reticle 1, as illuminated by the exposure illumination system 4, onto a wafer (second object) 3 which is the substrate to be exposed.

Denoted at T3 is optical means having a function for controlling curvature of image field. It includes two optical elements 41 and 42 having aspherical surfaces, to be described later. The optical means T3 is disposed adjacent to a pupil of the projection optical system 2. Denoted at 5 is a wafer holder for holding the wafer 3, and denoted at 6 is a wafer stage on which the wafer holder 5 is mounted. The wafer stage 6 produces X, Y and Z drives as well as 0 drive and tilt drive, for example, as is known in the art.

Denoted at 7 is an interference mirror and it is used for monitoring the position of the wafer stage 7 through an interferometer (not shown). On the basis of signals produced by the combination of the interference mirror 7 and the interferometer, not shown, a wafer stage drive control system (not shown) controls positioning of the wafer 3 so that it is placed at a predetermined position. Then, a projection exposure process is performed.

When the embodiment is applied to a scan type stepper, a reticle stage (not shown) on which the reticle 1 is placed as well as the wafer stage 6 are moved in a direction perpendicular to the optical axis of the projection optical system 2, at a mutual speed ratio corresponding to the imaging magnification of the projection optical system 2, whereby scan exposure is performed.

The stepper of this embodiment differs from a conventional stepper or scan type stepper in the point that the optical means T3 is provided along the projection light path. The remaining portion has essentially the same structure.

Generally, in a projection optical system having an ArF excimer laser (193 nm wavelength) as an exposure light source, since the wavelength of light from the ArF excimer laser is within a short wavelength region, selection of usable glass material is limited. Currently, only silica ($SiO_2$) and fluorite ($CaF_2$) are usable.

However, for such a short wavelength region, even silica raises a problem in the point of transmissivity. It absorbs exposure light, causing a thermal change (change in optical characteristic) and thus a change in imaging performance. The situation may be similar to a case where thermal change is caused by use of i-line (365 nm wavelength) as exposure light. Although several types of glass materials are usable for correction of chromatic aberration in the case of i-line, such glass materials include low-transmissivity materials.

For the reason above, a problem of thermal aberration may be raised even in the case of i-line. For a projection optical system using an ArF excimer laser, however, the situation is strict because of a decrease of depth of focus attributable to miniaturization of a pattern.

A glass material of a projection system may cause aberration changes in response to absorption of exposure light. There are many aberrations produced here, such as spherical aberration, coma, astigmatism and curvature of image field, for example. Among them, one of aberrations which are difficult to be corrected is curvature of image field. Although the amount of curvature of image field is practically very small, it raises a problem since the depth of focus has been decreased considerably in response to miniaturization of the pattern to be printed.

The inventors have found that, since the amount of curvature of field is of an order of 0.2–0.3 micron such that the amount of correction is small, the curvature can be corrected by the introduction of a transmission type optical element having a unique function.

In a specific structure of this embodiment, optical means comprising a pair of optical elements having aspherical surfaces is disposed along the light path of a projection system, and curvature of image field is corrected by changing the relative position of these optical elements with respect to a direction perpendicular to the optical axis.

The two optical elements having aspherical surfaces can have a variable optical power when combined, this being attained by mutually and laterally shifting them. As a result of such a lateral shift, the Petzval sum of the whole optical system is changed by which the curvature of image field is controlled. In this embodiment, a particular note has been paid to the fact that a change in curvature of field resulting from absorption of exposure light is small, and effective field curvature control is performed by using optical elements having only a small aspherical surface amount.

Since the absolute value of aspherical amount of the optical means is small, correction of only the field curvature is attainable without adversely affecting the other optical performance. This is very preferable as aberration correction.

A specific structure of optical means for correcting curvature of field, according to this embodiment, will be explained. This embodiment uses optical means which comprises two optical elements with aspherical surfaces, and they are so arranged that, when they are considered as a unit, a small optical power is provided and such optical power is made variable. For providing optical means of variable optical power, optical power controlling means based on lateral shift, such as disclosed in Japanese Published Patent Application, Publication No. 10034/1968 may be used.

The projection exposure apparatus of the sixth embodiment shown in FIG. 16 is an example wherein such optical means is used to correct curvature of field of a projection system.

Figure 17:
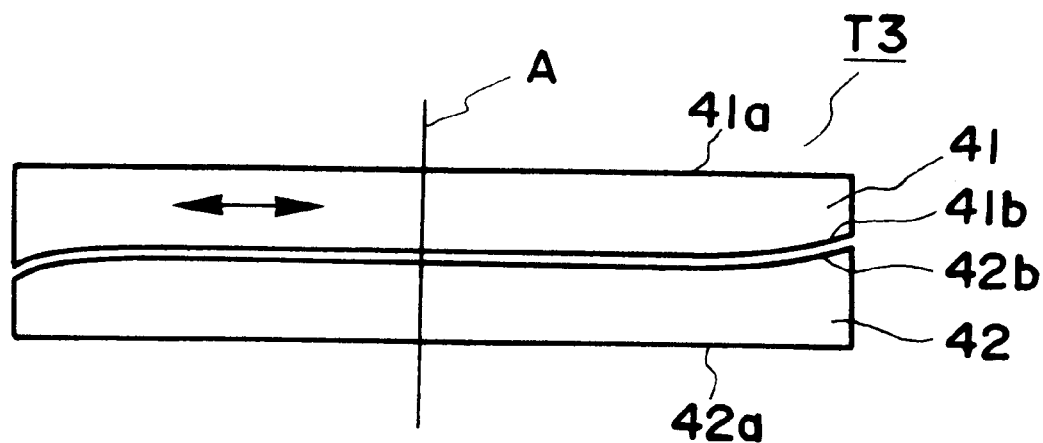
FIG. 17 is an enlarged view of a portion of FIG. 16.

Next, the structure of optical means T3 used in the sixth embodiment of FIG. 16 will be explained. FIG. 17 is a sectional view of a main portion of the optical means T3 having a function for controlling curvature of image field, according to the present embodiment.

In FIG. 17, two optical elements 41 and 42 disposed opposed to each other have flat outside faces 41a and 42a. The opposed surfaces 41b and 42b of them are aspherical surfaces of the same shape.

Here, X and Y axes are taken so that they extend perpendicularly to the optical axis A, and the aspherical surface of the optical element 41 is denoted by fa(x, y) while the aspherical surface of the optical element 42, opposed to the optical element 41, is denoted by fb(x, y). If the direction of shift is the X direction, the aspherical surface shapes of them are given by the following equations which are different in constant term, that is:

$$ra(x, y)=a(3xy^2+x^3)+b(2xy+x^2)+cx+d_1$$
$$fb(x, y)=a(3xy^2+x^3)+b(2xy+x^2)+cx+d_2 \quad (1c)$$

The reason that equation (1c) is not symmetrical with respect to x and y is that the optical elements 41 and 42 are arranged to produce a relative shift in the X direction. In order to produce optical power due to a lateral shift in the X direction, regarding x, terms up to cubic or third order are used.

In the initial stage, the aspherical surface shape fa(x, y) and the aspherical surface shape fb(x, y) can be completely fitted to each other and, therefore, the optical elements 41 and 42 have no optical power and they function in a unit merely as a parallel flat plate. The spacing between the optical elements 41 and 42 may preferably be made small as much as possible, and typically it may be about 100 microns, for example. Here, a case where the optical element 41 is shifted in the X direction by a distance $\Delta$ is considered. The influences produced here are, if a, b and c are constants, as follows:

$$fa(x+\Delta, y)-fb(x, y)=3a\Delta(x^2+y^2)+2b\Delta(x+y)+c\Delta+(d_1-d_2)+3a\Delta^2+b\Delta^2+a\Delta^3 \quad (2c)$$

Here, a higher order term of $\Delta$ may be disregarded because the amount of shift is small, and for better understanding of the effect of the embodiment, it is assumed that:

$$b=c=0 \quad (3c)$$

As a result, equation (2c) can be simplified and it can be rewritten as follows:

$$fa(x+\Delta, y)-fb(x, y)=3a\Delta(x^2+y^2)+(d_1-d_2) \quad (4c)$$

It is important in this embodiment that equation (4c) includes a term $(x^2+y^2)$. Thus, as a result of lateral shift of an amount $\Delta$, the optical elements 41 and 42 provide an optical system having an optical power which is revolutionally symmetric with respect to the optical axis and, additionally, the power can be changed as desired with the amount of lateral shift $\Delta$.

The procedure of producing lateral shift to provide a deviation, just corresponds to differentiation. For this reason, a third order term is included as the shape of the aspherical surface, and a second order component that provides optical power due to the effect of differentiation is set. This is the function of the optical elements 41 and 42.

While in this embodiment a relation b=c=0 is assumed in equation (3c) for simplicity, the term $2b\Delta(x+y)$ in equation (2c) corresponds to the amount of shift. Since, even if $b\neq 0$, the amount $\Delta$ is given or known for the purpose of power control, correction can be made with regard to the shift amount $\Delta$. The case where the shifting raises a problem specifically, is concerned with the alignment procedure. For a global alignment procedure, such a problem may be solved by controlling the stage so that the shift, which is to be caused by changing the relative position of the paired optical elements 41 and 42, is inversely corrected.

Further, when a suitable value is given to the term of constant c, there is an advantage that the absolute values of deviations, with respect to a flat plane, of aspherical surfaces as represented by fa(x, y) and fb(x, y) can be made smaller. Therefore, depending on the value of constant a, the constants b and c may not be set to zero and, rather, certain values may be given to them. Practically, the constant b may be set to zero, while a value of opposite sign to constant a may be given to constant c.

The absolute value of aspherical amount may raise a problem in relation to the measurement, rather than to the machining. Since the effect of constant c can be canceled by tilting the measurement beam, a relation c=0 may be set.

Generally, the absolute value of aspherical amount required for correcting a small value curvature of field of about 0.2 to 0.3 micron, is very small. While it depends on the positions of optical elements 41 and 42 placed, in practice, the effective amount may be a number of several in terms of Newton's fringes. As a typical example, if the amount to be produced as a power component is 1 micron and the lens diameter is 200 mm and the shift amount $\Delta$ is 5 mm, then, from equation (4a), it follows that:

$$3a \times 5 \times 100 \times 100 = 0.001.$$

Therefore, $$a=6.7\times 10^{-9}$$

is obtained.

The value 100 shows the radius (the diameter is 200 mm). If b=c=0, the aspherical amount along a section y–0 according to equation (1c) will be:

$$6.7\times 10^{-9} \times 100 \times 100 \times 100 = 6.7\times 10^{-3}.$$

This means that the optical elements 41 and 42 have an aspherical amount of $\pm 6.7$ microns.

In order to reduce the amount of actual deviation from a flat plane, the term of constant c may be added to this. Since the value of constant c with which a value of 6.7 microns is determined in reference to 100 mm is $6.7\times 10^{-5}$, the constants a and c may be set with opposite signs, and $$c=-6.7\times 10^{-5}$$

may be set. Then, a deviation of an aspherical amount in the section y–0 from a flat plane can be reduced up to $\pm 2.6$ microns.

Figure 18:
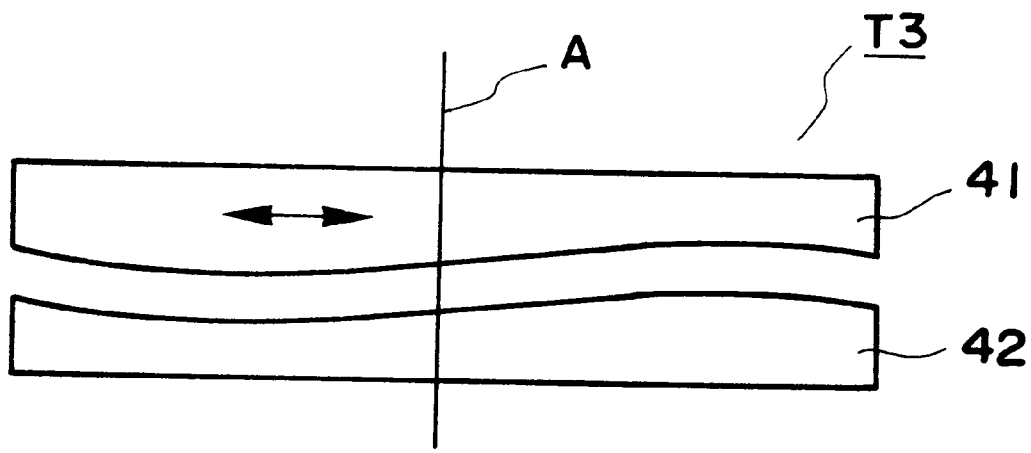
FIG. 18 is an enlarged view of a portion of FIG. 16.

FIG. 17 shows an aspherical surface shape when the constant c is zero, and FIG. 18 shows the shape along the section y=0 as the above-described value is substituted into constant c. Since within the range of diameter of 200 mm the aspherical surfaces have slowly changing shapes and, additionally, the optical elements 41 and 42 have mutually complementing shapes, production of aberration resulting from a change in relative position of the optical elements 41 and 42 does not apply substantial influence to the other optical performance. Additionally, fine correction of only curvature of field is assured. In some cases, slight correction may be necessary to other optical characteristics, but as a whole of the projection optical system, it can be said that there is no change in performance.

Controlling the correction of a change in curvature of field by use of aspherical surface means, with the amount of correction being made variable, is a unique concept, and this embodiment of the present invention is contributable to improvement of the function of a projection exposure apparatus for the manufacture of semiconductor devices.

Further, since the amount of curvature of field to be controlled is small, the aspherical surface to be used can be made small as can be measured by use of an interferometer. This is another feature of the present invention.

Since in this embodiment a desired optical characteristic can be produced on the basis of a deviation between two aspherical surfaces shifted laterally, the aspherical amount of the optical element 41 or 42 itself may be a value larger by one digit than the amount of lateral deviation. In the example described above, an aspherical amount of 6.7 microns is required to provide a value of 1 micron as the effect of lateral shift. With the optimization of tilt, in addition to this, the value can be reduced to $\pm 2.6$ microns, which is within the range of high precision measurement of an interferometer. For manufacture of an aspherical surface, it is important to check whether the surface is formed exactly into a desired shape, but with the precision as required in this embodiment, conventional techniques are applicable to obtain a desired result.

Further, in this embodiment, adjustment of optical power is based on the use of an optical element having a refracting function. Thus, the present embodiment provides a large advantage to both of the refraction type and catadioptric type which are employed in a projection exposure apparatus.

A driving mechanism (not shown) which serves to change and adjust the positional relation of aspherical surfaces of the optical elements 41 and 42 may be actuated in accordance with the characteristic of curvature of field which may be stored beforehand in a central processing unit of the projection exposure apparatus. The drive amount (correction amount) may be calculated and controlled in accordance with the characteristic of exposure image field (curvature), having been stored in the apparatus on the basis of experiments or simulations, and by use of exposure amount, reticle pattern proportion, and exposure energy, for example. Alternatively, without calculation based on the characteristic of the system having been memorized, the drive amount may be controlled while monitoring the characteristic of the projection optical system. The amount of produced curvature of field resulting from the exposure has a correlation with focus change due to the exposure process, and, while monitoring focus position or the amount of focus change due to the exposure and converting it to the field curvature amount, the drive amount may be calculated.

As a matter of course, the amount of field curvature may directly be measured and the measured value may be fed back to the drive amount for changing the relative position of the optical elements 41 and 42.

Figure 19:
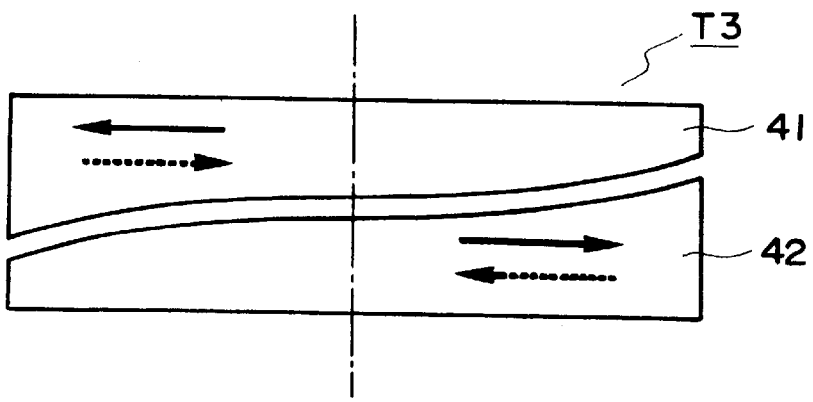
FIG. 19 is a schematic view of a modified form of a portion of FIG. 16.

While in the sixth embodiment one of the optical elements is laterally shifted in the X direction, as an alternative, one may be moved by $\delta$ in the X direction and the other may be moved by $-\delta$ in the X direction. FIG. 19 shows such an example. That is, since $$fa(x+\delta, y)-fb(x-\delta, y)=2a[(3\delta(x^2+y^2)+\delta^3]2+2b\delta(2y^2+1)+2c\delta+d_1-d_2,$$

it, like the foregoing example, $$b=c=0,$$

and $$|\delta|\approx 0$$

are assumed, then:

$$fa(x+\delta, y)-fb(x-\delta, y)\approx 6a\delta(x^2+y^2)+d_1-d_2.$$

Thus, if $\Delta=\delta$, the amount of optical power change becomes twice. Alternatively, for obtaining the same power change, the value of coefficient (constant) a can be halved. This leads to halving the aspherical surface amount and thus it facilitates evaluation of the shape. Further, the amount of shift can be halved, to obtain the same power change. This is very advantageous in space of the driving system or positioning precision.

Figure 20:
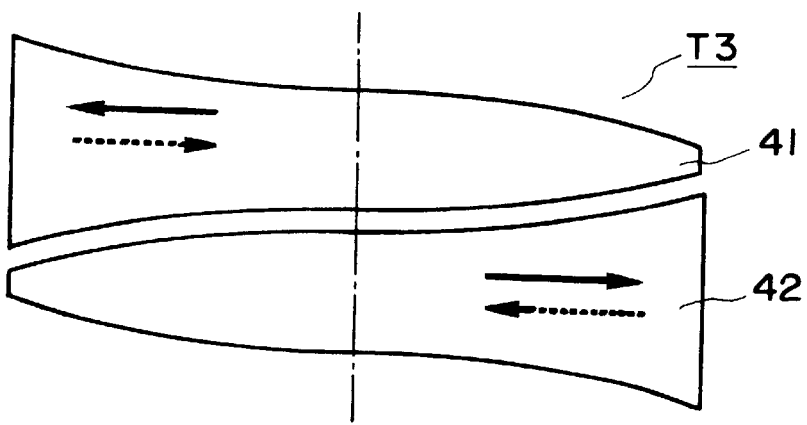
FIG. 20 is a schematic view of a modified form of a portion of FIG. 16.

While the sixth embodiment has been described with reference to a system where one surface of an optical element is aspherical, both surfaces of the optical element may be aspherical. FIG. 20 shows such an example. Here, if the thickness of the optical elements 41 and 42 is thin, the advantageous effects having been described above are accumulated simply. Therefore, if the aspherical surface has the same shape, the value of coefficient a can be reduced to a half, to obtain the same change in optical power. Also, only one optical element may be moved or, alternatively, both of the optical elements may be moved in opposite directions.

Figure 21:
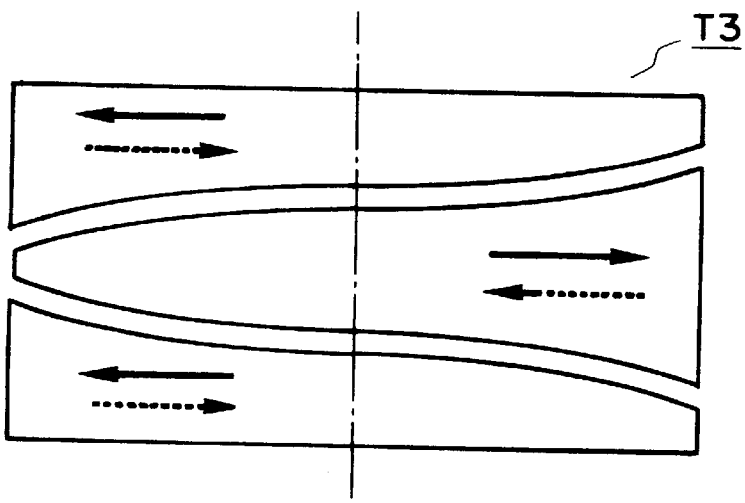
FIG. 21 is a schematic view of a modified form of a portion of FIG. 16.

Plural sets of paired optical elements may be used, with similar advantageous effects. FIG. 21 shows such an example.

Figure 22:
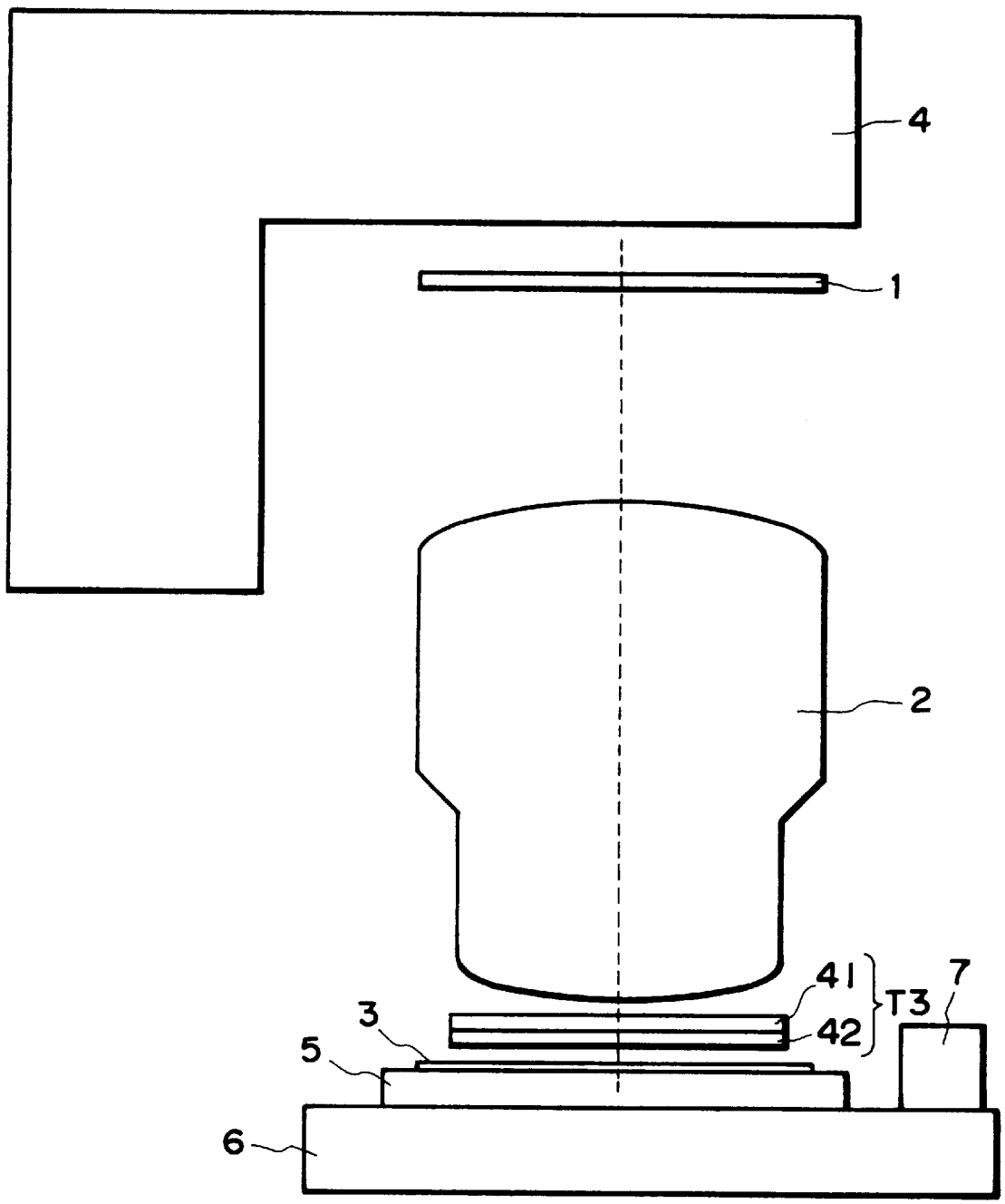
FIG. 22 is a schematic view of a main portion of a projection exposure apparatus according to a seventh embodiment of the present invention.

FIG. 22 is a schematic view of a main portion of a seventh embodiment of the present invention. In this embodiment, the optical means T3 is disposed along the light path between the projection optical system 2 and the wafer 3. Thus, the position of insertion of the optical means T3 to the light path differs from the sixth embodiment of FIG. 16. The remaining portion has substantially the same structure.

In this embodiment, a combination of optical elements having aspherical surfaces as having been described hereinbefore is interposed between the projection optical system 2 and the wafer 3 and, with a lateral shift of them, curvature of field is corrected. The function of the optical elements is essentially the same as that of the sixth embodiment. As in the present embodiment, the optical means may be disposed at a suitable position other than a position adjacent to the pupil of the projection optical system 2.

The optical means T3 may preferably be disposed at one of a position adjacent to the pupil plane of the projection optical system 2, a position between the projection optical system 2 and the wafer 3 and a position between the projection optical system 2 and the reticle 1, because at these positions the independence of aberration control is relatively high which is preferable to control.

In the sixth and seventh embodiments described above, when correction of curvature of field is made, the set value of best focus may change very slightly. Since, however, the amount of such change may be calculated or determined on the basis of the amount of drive of the aspherical surface optical element, the amount of focus change may be reflected within the CPU of the projection exposure apparatus to the control of the wafer surface position with respect to the optical axis direction. As regards other optical performance such as magnification, the influence to such optical performance can also be calculated on the basis of the amount of drive of the aspherical surface, similarly. Thus, it can be corrected easily.

In this embodiment, the amount of produced field curvature is variable, such that it meets various changes. Also, the spherical amount used is very small and, only the curvature of field can be controlled without adversely affecting the other optical performance.

In the present invention, at least two of the optical means T1 having a function for controlling axial astigmatism, the optical means T2 having a function for controlling revolutionally asymmetrical magnification, and the optical means T3 having a function for controlling curvature of field, may be selected. They may be used separately or arranged into an integral structure, and may be disposed along the light path (where the optical means T13 of the third embodiment of FIG. 8 corresponds to the selected optical means T1 and T3), to thereby correct two or three of axial astigmatism, asymmetric magnification and curvature of field.

Figure 23:
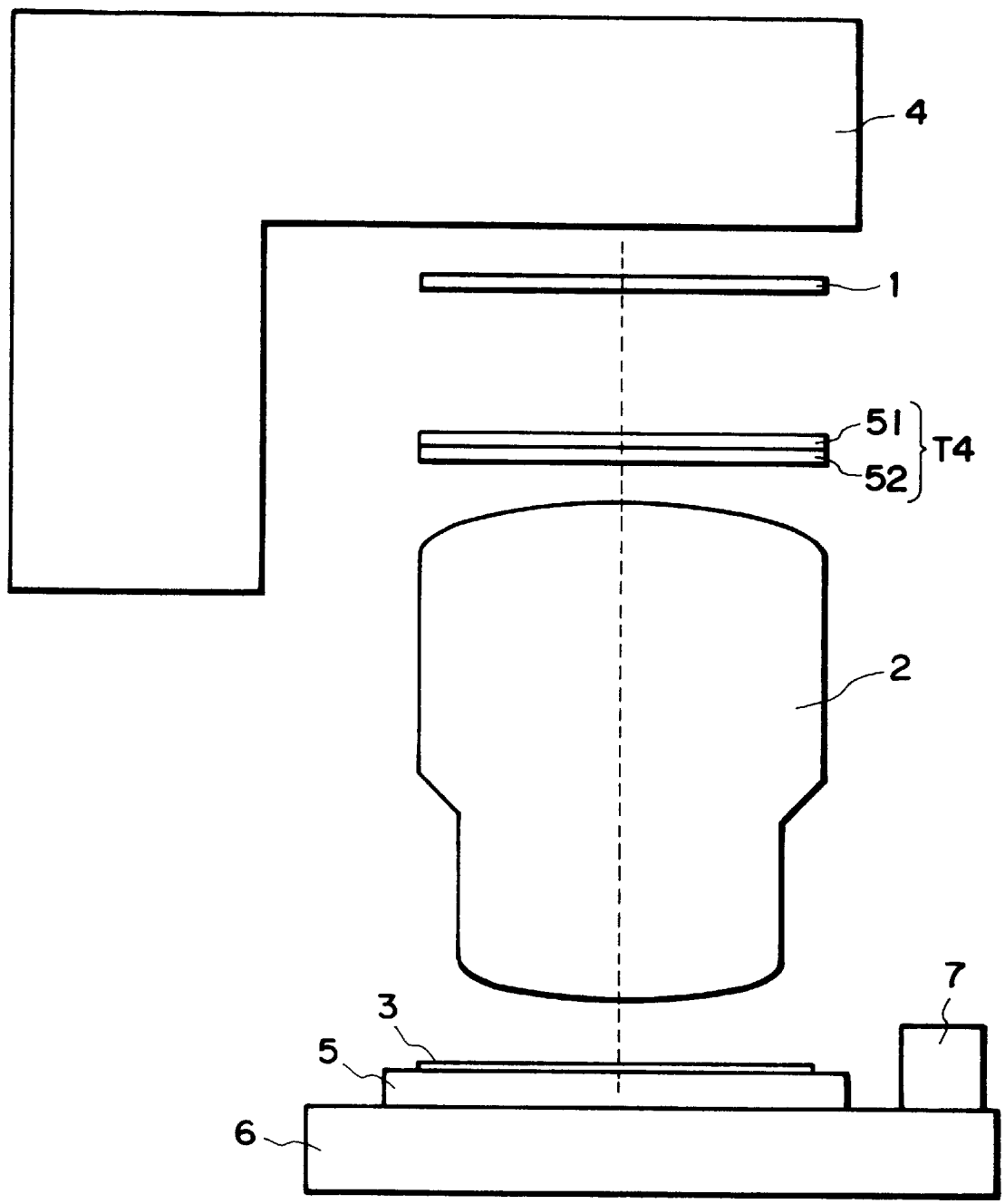
FIG. 23 is a schematic view of a main portion of a projection exposure apparatus according to an eighth embodiment of the present invention.

FIG. 23 shows an eighth embodiment of the present invention, and this is an example where, in an ordinary stepper or scan type stepper for manufacture of semiconductor devices, a pair of optical elements with aspherical surfaces are interposed between a projection optical system and a reticle, for correction of cubic or third-order distortion. Here, the third-order distortion includes a magnification component and a distortion component having a third-order characteristic, called a barrel type or spindle type.

As regards distortion, there are known measures to control magnification and third-order distortion. An example is that plural elements within a projection optical system are displaced along the optical axis direction, or the pressure of a gas sealingly provided between optical elements is changed. Since magnification is a fundamental quantity of an optical system, it can be changed without changing the other aberrations. As regards correction of third-order distortion, however, there is a problem of changes in aberration resulting from displacement or a problem of a small range of adjustment. Thus, correction has to be taken into account even in the initial stage of design. Particularly, in consideration of the use of different imaging methods such as a modified illumination method and a phase shift mask, for example, there will occur a problem of matching of distortion in these imaging methods. It is, therefore, important to control third-order distortion without an additional burden to design.

In this embodiment, third-order distortion is corrected and controlled with a minimum limitation to design, while the effect to the other optical performance is reduced to a minimum.

This embodiment is applied to a scan type exposure apparatus (stepper), and a pair of optical elements having aspherical surfaces are disposed at a position within a projection optical system, closest to a reticle. At least one of these optical elements is shifted in a direction perpendicular to the optical axis, to adjust the relative position of the optical elements, whereby third-order distortion of the projection optical system with respect to a direction perpendicular to the scan direction is corrected.

In this embodiment, the direction of lateral shift is registered with the direction perpendicular to the scan direction, whereby correction of third-order distortion to be produced in the scan type exposure apparatus can be corrected.

The projection optical system to which this embodiment is applied may be either of refraction type or catadioptric type. Also, the projection optical system is provided with means for controlling magnification.

In the case of a scan type exposure apparatus, a difference in magnification between X and Y directions can be easily corrected by adjusting the speed ratio of the reticle and the wafer, being moved in synchronism with each other. Thus, correction of third-order distortion can be performed with reference to the direction perpendicular to the scan direction, by using two optical elements with aspherical surfaces. In this embodiment, third-order distortion can be controlled as desired, such that enhanced matching precision is assured. For the magnification component which may be optically corrected easily, any known method such as moving an element of the projection optical system along the optical axis direction or controlling the pressure within the optical system, may be used in this embodiment. For correction of the third-order distortion component, the optical means is used.

Figure 24:
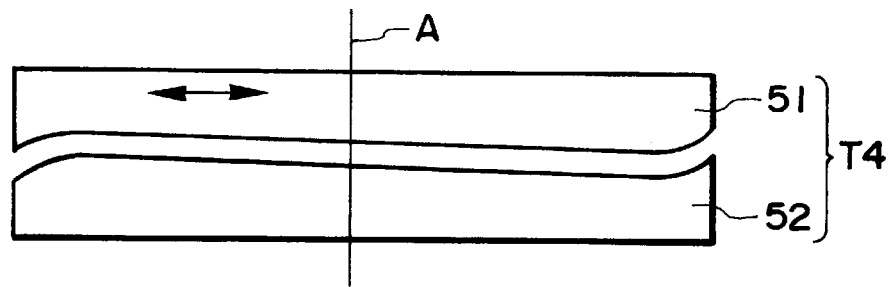
FIG. 24 is an enlarged view of a portion of FIG. 23.

FIG. 23 is a schematic view of a main portion of a scan type exposure apparatus, wherein denoted at 1 is a reticle and denoted at 2 is a projection optical system. Denoted at 3 is a wafer, and denoted at 4 is an illumination optical system. Denoted at 5 is a wafer holder, and denoted at 7 is a mirror mounted for laser interferometer measurement, for the control of the stage. The exposure apparatus is of a scan type, and the reticle and the wafer are scanningly moved in synchronism with each other, whereby a pattern of the reticle is transferred to the wafer. The structure of FIG. 23 is essentially the same as that of an ordinary stepper or scan type stepper, except for the provision of optical means T4 (51 and 52). FIG. 24 shows details of it. Optical elements 51 and 52 are disposed opposed to each other, and outside faces of them are flat. The opposed faces of these optical elements are spherical surfaces of the same shape.

Here, X and Y axes are taken so that they extend perpendicularly to the optical axis A, while the Y direction is taken so that it is registered with the scan direction of the exposure apparatus. The aspherical surface of the optical element 51 is denoted by fa(x, y) while the aspherical surface of the optical element 52, opposed to the optical element 51, is denoted by fb(x, y). Then, the aspherical surface shapes of them are given by the same quintic equations which are different in constant term, that is:

$$fa(x, y) = ax^5 + b1$$

$$fb(x, y) = ax^5 + b2 \qquad (1d)$$

The reason that the above equations have no term of y is that the optical characteristic is given only in the direction (X direction) perpendicular to the scan direction (Y direction). As regards the Y direction along which the scanning is made, higher-order distortion is canceled due to averaging resulting from the scan. Thus, control of third-order distortion is made only with respect to the X direction. The optical elements 51 and 52 are used to allow shift of the relative position in the X direction. Since such lateral shift produces third-order distortion, as regards the shape of an aspherical surface, the quintic term is necessary.

In the initial stage, the aspherical surface shape fa(x, y) and the aspherical surface shape fb(x, y) can be completely fitted to each other and, therefore, the optical elements 51 and 52 have no optical power and they function merely as a parallel flat plate. The spacing between the optical elements 51 and 52 may preferably be made small as much as possible, and typically it may be about 100 microns. Here, a case where only the optical element 51 is shifted in the X direction by a distance A is considered. The influences produced here are as follows:

$$fa(x+\Delta, y) - fb(x, y) = 5a\Delta x^4 + 10a\Delta^2 x^3 + 10a\Delta^3 x^2 + 5a\Delta^4 x + (b1-b2) \qquad (2d)$$

Here, a higher order term of Δ may be disregarded because the amount of shift is small. Then, equation (2) can be simplified, and it follows that:

$$fa(x+\Delta, y) - fb(x, y) = 5a\Delta x^4 + (b1-b2) \qquad (3d)$$

It is important in this embodiment that equation (3d) includes a term $x^4$. Thus, as a result of a lateral shift of amount Δ, the optical elements 51 and 52 provide an optical system having a fourth-order characteristic only in the X direction and, additionally, the characteristic can be changed as desired with the amount of lateral shift Δ.

The procedure of producing lateral shift to provide a deviation, just corresponds to differentiation. For this reason, a seventh order term is included as the shape of the aspherical surface, and a fourth order component that provides optical power due to the effect of differentiation is set. This is the function of the optical elements 51 and 52.

Generally, the absolute value of the aspherical amount required for correcting a small distortion for the above-described matching, is very small. As a typical example, if the aspherical amount for producing a desired distortion is 1 micron while the lens diameter is 200 mm and the shift amount Δ is 5 mm, then, from equation (3d), it follows that:

$$5ax5 \times 10^{-8} = 0.001.$$

Therefore, $$a = 4.00 \times 10^{-13}$$

is obtained.

The value 100 shows the radius (the diameter is 200 mm). Thus, from equation (1d), the aspherical amount will be:

$$4.0 \times 10^{-13} \times 10^{-10} = 4.007 \times 10^{-3}.$$

This means that the optical elements 51 and 52 have an aspherical amount of ±4.00 microns.

In order to reduce the amount of actual deviation from a flat plane, a term of cx which is the first-order term of x may be added to this. Since the value of c with which a value of 4.00 microns is determined in reference to 100 mm is $4.0 \times 10^{-5}$, the constants a and c may be set with opposite signs, and $$c = -2.86 \times 10^{-5}$$

may be set. Then, a deviation of an aspherical amount from a flat plane can be reduced up to ±2.14 microns. Since within the range of diameter of 200 mm the aspherical surfaces have slowly changing shapes and, additionally, the optical elements 51 and 52 have mutually complementing shapes, production of aberration resulting from a change in relative position of the optical elements 51 and 52 do not apply substantial influence to the other optical characteristic. Thus, only the third-order distortion can be corrected.

In this embodiment, the direction of correction of the third-order distortion is perpendicular to the scan direction of the exposure apparatus. However, because the amount of correction is small and an absolute value of shift can be suitably selected, the aspherical surface to be used can be small as can be measured by use of an interferometer. In this embodiment, a desired optical characteristic can be produced by the amount of shift of two aspherical surfaces and, therefore, the original aspherical amount, that is, the aspherical amount of the optical element 51 or 52 itself is larger than that which is to be finally obtained. In the example described above, an aspherical surface of 4.00 microns is required for each of the optical elements, in order to attain an aspherical amount of 1 micron. When tilt optimization is made in addition to this, the amount can be reduced to 2.14 microns, which is sufficiently within the range of high precision measurement of an interferometer. In the manufacture of an aspherical surface, it is important that a product surface exactly has a surface shape desired. However, because the aspherical amount required in this embodiment is such as described, conventional techniques may be applied satisfactorily. If further reduction of the amount is desired, the shift amount of 5 mm may be enlarged.

Actuation of at least one of the aspherical surface optical elements may be changed in accordance with a sequence which may be memorized beforehand in the apparatus, or it may be made on the basis of an actual measured value of a wafer. For example, if the third-order distortion changes with different illumination modes or different numerical apertures, the amount of change may be memorized beforehand and lateral shift of the aspherical surface optical elements may be done in response to the change of illumination mode or numerical aperture. On such an occasion, the magnification component may be corrected simultaneously by using any known means.

In place of such preparatory setting, a reticle with which distortion measurement is attainable may be used to analyze the distortion within the picture field, and the magnification component and third-order distortion component may be corrected on the basis of the resultant value. On such an occasion, measurement may be made automatically within the apparatus or it may be made in the off-line manner wherein an image of a reticle is once printed or a wafer and measurement is made thereto.

Figure 25:
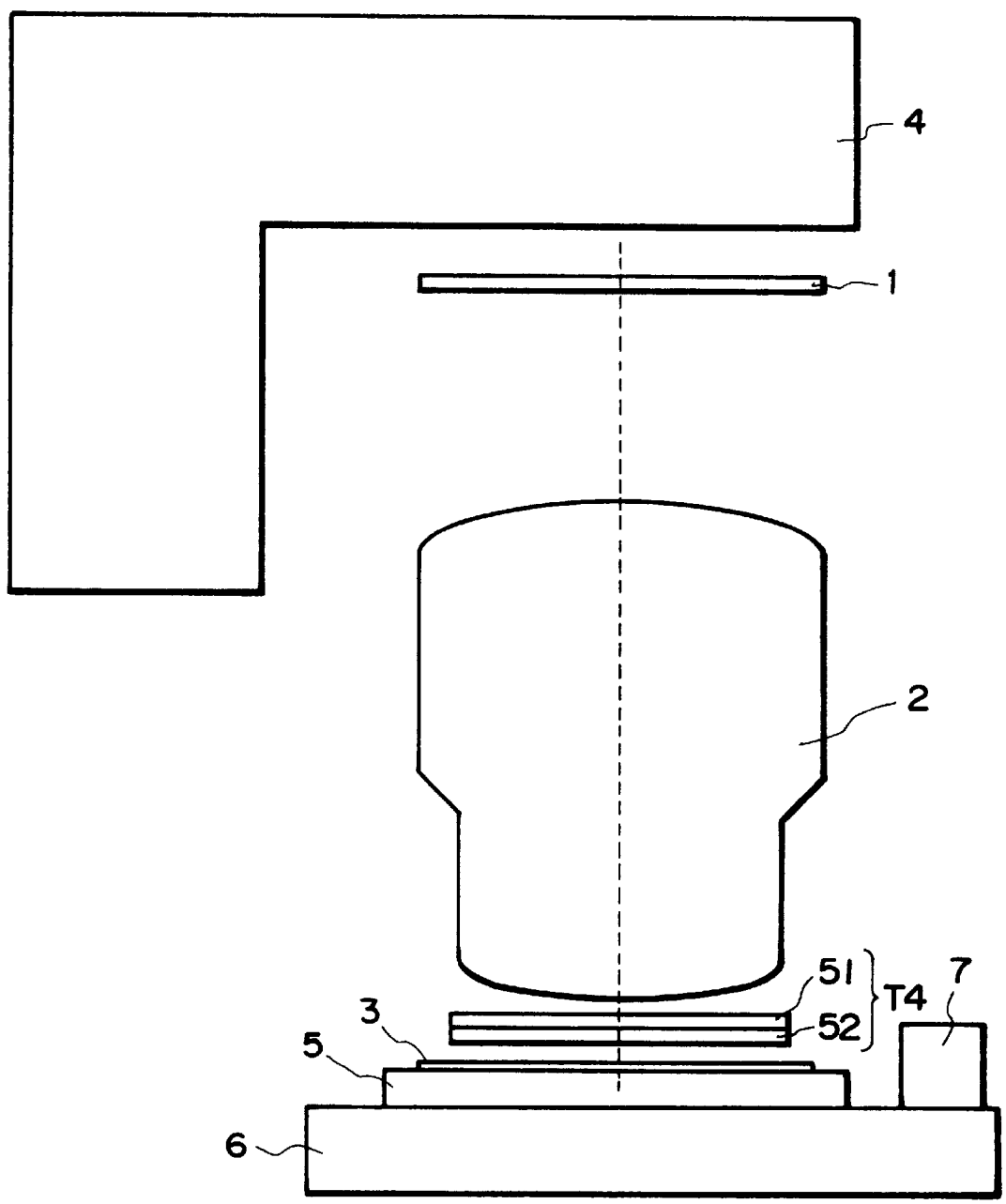
FIG. 25 is a schematic view of a main portion of a projection exposure apparatus according to a ninth embodiment of the present invention.

FIG. 25 shows a semiconductor exposure apparatus according to a ninth embodiment of the present invention. It differs from the eighth embodiment in that two optical elements 51 and 52 constituting the optical means T4 for third-order distortion control are provided between a wafer and a projection optical system. The remaining portion has essentially the same structure and function as those of the eighth embodiment.

In the eighth and ninth embodiments described above, only one of two aspherical surface optical elements disposed opposed to each other is moved to obtain a desired optical characteristic. However, the relative motion of opposed optical elements is not limited to this. For example, the upper optical element 51 may be moved rightwardly by $\Delta$ while the lower optical element 52 may be moved leftwardly by $\Delta$.

Further, in the above-described examples, the third-order distortion correction is made only with respect to a direction perpendicular to the scan direction. However, where the slit width in the scan direction is enlarged or the invention is to be applied to a stepper, the shape of an aspherical surface may be made as follows:

$$ga(x, y) = a(x^5 + 5x^4 y) + b1$$

$$gb(x, y) = a(x^5 + 5x^4 y) + b2 \tag{4d}$$

In the initial stage, the aspherical surface shape ga(x, y) and the aspherical surface shape gb(x, y) can be completely fitted to each other and, therefore, the optical elements 51 and 52 have no optical power and they function in a unit merely as a parallel flat plate. The spacing between the optical elements 51 and 52 may preferably be made small as much as possible, and typically it may be about 100 microns, for example. Here, a case where the optical element 51 is shifted in the X direction by a distance $\Delta$ is considered. The influence produced here is, if the effect of a higher order term of $\Delta$ is disregarded because it is small, as follow:

$$ga(x+\Delta, y) - gb(x, y) = 5a\Delta(x^4 + y^4) + (b1 - b2) \tag{4d}$$

It is important in this embodiment that equation (5d) includes a term $(x^4 + y^4)$. Thus, as a result of a lateral shift of amount $\Delta$, the optical elements 51 and 52 provide an optical system having a fourth-order characteristic which is revolutionally symmetric with respect to the optical axis and, additionally, this characteristic can be changed as desired with the amount of lateral shift $\Delta$.

The procedure of producing a lateral shift to provide a deviation, just corresponds to differentiation. For this reason, a seventh order term is included as the shape of the aspherical surface, and a fourth order component is provided due to the effect of differentiation. This is the function of the optical elements 51 and 52.

In this manner, the third-order distortion can be controlled as desired. As regards the position of the optical elements 51 and 52, they may be disposed between a reticle and a projection optical system, as in the preceding embodiment, or alternatively, they may be disposed between the projection optical system and a wafer. Further, if desired, they may be provided within the projection optical system.

Figure 26:
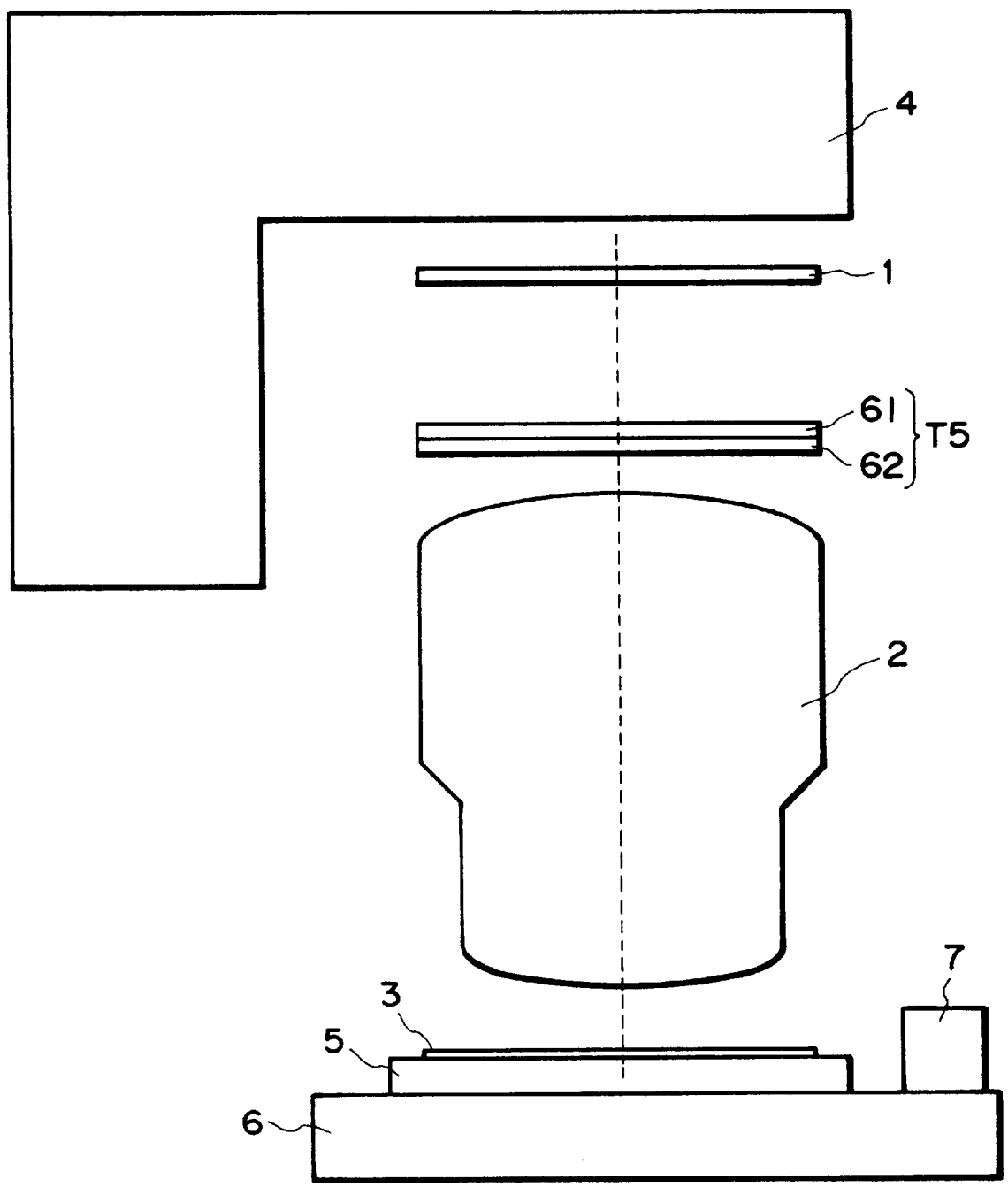
FIG. 26 is a schematic view of a main portion of a projection exposure apparatus according to a tenth embodiment of the present invention.

FIG. 26 is a schematic view of a main portion of a projection exposure apparatus according to a tenth embodiment of the present invention. In this embodiment, the invention is applied to a projection exposure apparatus of an ordinary stepper type or a scan type.

Denoted in the drawing at 4 is an exposure illumination system for illuminating a reticle (first object) 1. The exposure illumination system 4 has a known structure which may comprise as a light source an ArF excimer laser (193 nm wavelength) or a KrF excimer laser (248 nm wavelength), or alternatively, it may comprise a lamp that provides light of g-line (436 nm wavelength) or i-line (365 nm wavelength). Also, the illumination system may comprise a known optical system.

Denoted at 1 is a reticle, and denoted at 2 is a projection optical system of a refraction type or of a catadioptric system. It serves to project a circuit pattern of the reticle 1, as illuminated by the exposure illumination system 4, onto a wafer (second object) 3 which is the substrate to be exposed.

Denoted at T5 is optical means having a function for controlling higher order distortion. It includes two optical elements 61 and 62 having aspherical surfaces, to be described later. At least one of the optical elements 61 and 62 can be shifted in a direction perpendicular to the optical axis to change the relative position of the elements 61 and 62, to thereby correct higher order distortion with respect to this direction. The optical means T5 is disposed between the reticle 1 and the projection optical system 2. Denoted at 5 is a wafer holder for holding the wafer 3, and denoted at 6 is a wafer stage on which the wafer holder 5 is mounted. The wafer stage 6 produces X, Y and Z drives as well as θ drive and tilt drive, for example, as is known in the art.

Denoted at 7 is an interference mirror and it is used for monitoring the position of the wafer stage 6 through an interferometer (not shown). On the basis of signals produced by the combination of the interference mirror 7 and the interferometer, not shown, a wafer stage drive control system (not shown) controls positioning of the wafer 3 so that it is placed at a predetermined position. Then, a projection exposure process is performed.

When the embodiment is applied to a scan type projection exposure apparatus, a reticle stage (not shown) on which the reticle 1 is placed as well as the wafer stage 6 are moved in a direction perpendicular to the optical axis A of the projection optical system 2, at a mutual speed ratio corresponding to the imaging magnification of the projection optical system 2, whereby scan exposure is performed.

The apparatus of this embodiment differs from a conventional stepper or scan type stepper in the point that the optical means T5 is provided along the projection light path. The remaining portion has essentially the same structure.

In the embodiment of FIG. 26, the optical means T5 which comprises paired optical elements with aspherical surfaces, for higher order distortion correction, is disposed between the projection optical system 2 and the reticle 1.

Here, the higher order distortion refers to distortion components of orders not lower than fourth-order, with the magnification component and components up to third-order characteristics (barrel type or spindle type) with respect to image height value being excluded.

The projection optical system to which the present embodiment is applied may be of refraction type or catadioptric type. The projection optical system has a function for controlling the magnification and third-order distortion. Control means for the magnification and third order distortion may be of a known type, such as, for example, a method wherein an optical element such as a lens of a projection optical system is moved along the optical axis direction, or a method wherein the pressure of a space in a portion of a projection optical system is controlled. Any of these methods is applicable to this embodiment. However, these methods are effective only to control the magnification and lower order distortion such as distortion up to the third order. They are not effective to control higher order distortion.

When imaging methods such as a modified illumination method and a phase shift mask method are used in combination, there arises a problem of matching in distortion between these imaging methods. Matching errors are mainly attributable to a production error of an optical system.

According to the analyses of such a matching error made by the inventors, it has been found that, if magnification and third order distortion are corrected, the major components of such error are higher order distortion and magnification difference in orthogonal X and Y directions. In the case of a scan type exposure apparatus, the magnification difference in orthogonal two directions can be corrected easily by adjusting the speed ratio during the synchronous scan. However, to adjust a higher order component is difficult to attain, with a conventional optical system. This is because of the fact that, even if an optical element is moved in the optical axis direction or if the pressure in the space within the projection optical system is controlled, the result is only that distortions up to the third order are changed, and substantially no change occurs in the higher order distortions of orders not lower than the fifth order.

However, when an imaging method such as a modified illumination method or phase shift mask method are used in order to enlarge the depth of focus or to meet resolution of finer patterns, the value of higher order distortion will change with the number of imaging methods used. Thus, to control a higher order value as desired is very important in the point of enhancement of matching precision.

In the tenth embodiment, such higher order distortion, the amount of production of which has been difficult to control with conventional projection optical systems, can be controlled as desired by use of optical elements having aspherical surfaces, by which matching precision can be improved significantly.

To this end, in this embodiment, for the control of the magnification component and third order distortion, known means may be used, such as, for example, moving optical elements of a projection optical system in the optical axis direction, moving a reticle in the optical axis direction, or controlling the pressure within the optical system. For the higher order distortion, the optical means T5 is used to correct the same.

Next, the specific structure of the optical means T5 for producing and controlling higher order distortion, will be explained.

In this embodiment, the optical means T5 which comprises paired optical elements with aspherical surfaces is used to produce higher order distortion in the projection optical system 2. For such optical means, a known optical means such as disclosed in Japanese Published Patent Application, Publication No. 10034/1968 may be used.

Figure 29:
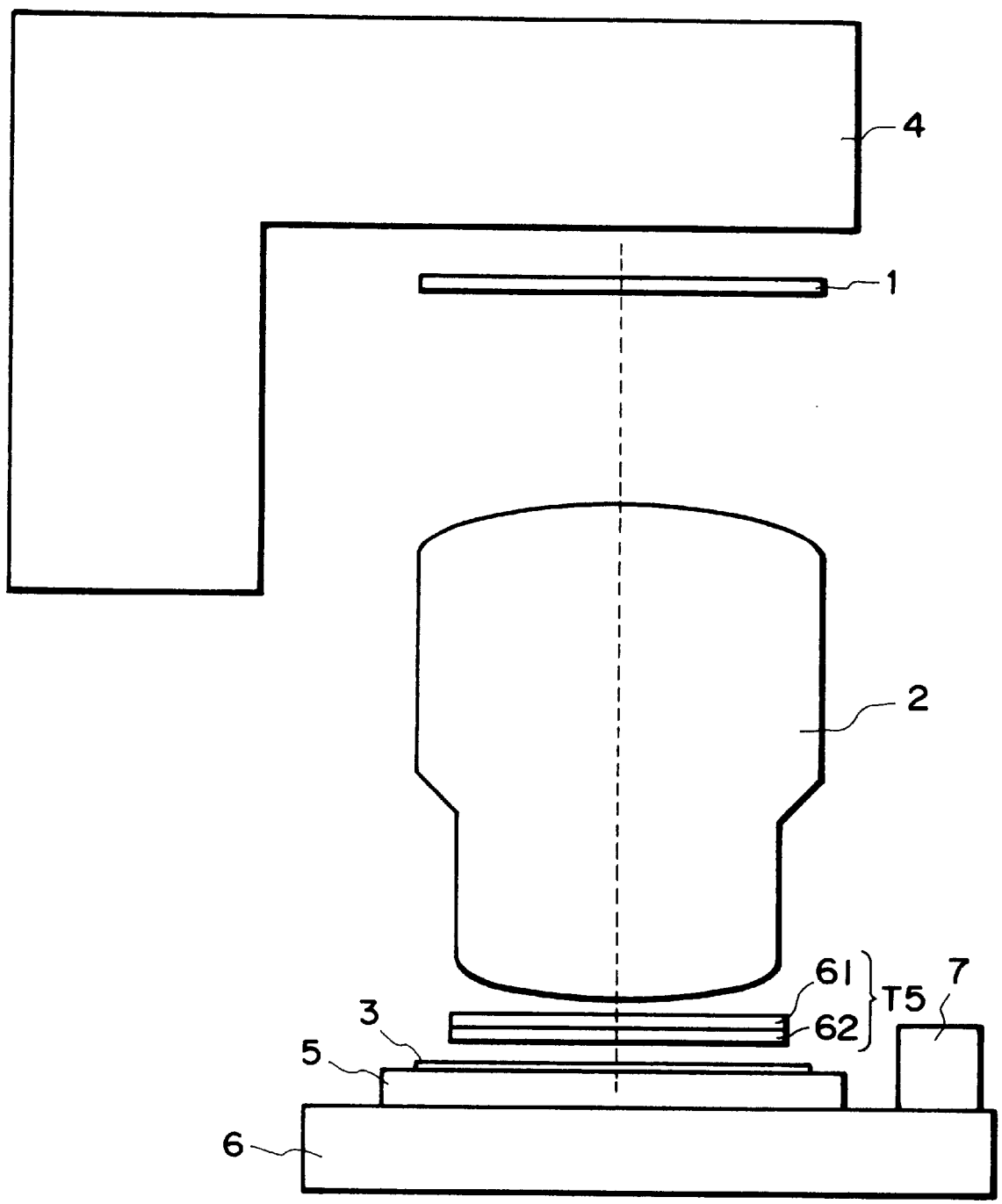
FIG. 29 is a schematic view of a main portion of a projection exposure apparatus according to an eleventh embodiment of the present invention.

FIG. 29 is a schematic view of a main portion of the optical means T5 of this embodiment. The optical means T5 of this embodiment comprises optical elements 61 and 62 disposed opposed to each other. Outside faces of the optical elements 61 and 62 are flat while opposed faces of the optical elements 61 and 62 are aspherical having the same shape.

Here, X and Y axes are taken so that they extend perpendicularly to the optical axis A, while the Y direction is taken so that it is registered with the scan direction of the exposure apparatus. The aspherical surface of the optical element 61 is denoted by fa(x, y) while the aspherical surface of the optical element 62, opposed to the optical element 61, is denoted by fb(x, y). Then, the aspherical surface shapes of them are given by the same equations which are different only in constant term, that is:

$$fa(x, y) = ax^7 + b1 \tag{1e}$$

$$fb(x, y) = ax^7 + b2$$

The reason that the above equations have no term of y is that the optical means T5 produces an optical characteristic in the projection optical system only with respect to the direction (X direction) perpendicular to the scan direction (Y direction). As regards the Y direction along which the scanning is made, higher-order distortion is canceled due to an averaging effect resulting from the scan. Thus, control of higher order distortion is made only with respect to the X direction. The optical elements 61 and 62 are used to allow a shift of the relative position in the X direction. Since such a lateral shift produces higher order distortion, as regards the shape of an aspherical surface, a term of x not lower than seventh order is necessary.

In the initial stage, the aspherical surface shape $fa(x, y)$ and the aspherical surface shape $fb(x, y)$ can be completely fitted to each other and, therefore, the optical elements 61 and 62 have no optical power and they function merely as a parallel flat plate. The spacing between the optical elements 61 and 62 may preferably be made small as much as possible, and typically it may be about 100 microns. Here, a case where only the optical element 61 is shifted in the X direction by a distance $\Delta$ is considered. The influences produced here are as follows:

$$fa(x+\Delta, y)-fb(x, y)=7a\Delta x^6+21a\Delta^2 x^5+35a\Delta^3 x^4+35a\Delta^4 x^3+21a\Delta^5 x^2 +7a\Delta^6 x+\Delta^7+(b1-b2) \tag{2e}$$

Here, a higher order term of $\Delta$ may be disregarded because the amount of shift is small. Then, equation (2e) can be simplified, and it follows that:

$$fa(x+\Delta, y)-fb(x, y)=7a\Delta x^6+(b1-b2) \tag{3e}$$

It is important in this embodiment that equation (3e) includes a term $x^6$. Thus, as a result of a lateral shift of amount $\Delta$, the optical elements 61 and 62 provide an optical system having a sixth-order characteristic only in the X direction and, additionally, the characteristic can be changed as desired with the amount of lateral shift $\Delta$.

The procedure of producing lateral shift to provide a deviation, just corresponds to differentiation. For this reason, a seventh order term is included as the shape of the aspherical surface, and a sixth order component resulting from the effect of differentiation is set. This is the function of the optical elements 61 and 62.

Generally, the absolute value of an aspherical amount required for correcting a small distortion for the above-described matching, is very small. As a typical example, if the aspherical amount for producing a desired distortion is 1 micron while the lens diameter is 200 mm and the shift amount $\Delta$ is 5 mm, then, from equation (3e), it follows that:

$$7ax5\times10^{-12}=0.001.$$

Therefore, $$a=2.86\times10^{-17}$$

is obtained.

The value 100 shows the radius (the diameter is 200 mm). Thus, from equation (1e), the aspherical amount will be:

$$2.86\times10^{-17}\times10^{-14}=2.86\times10^{-3}.$$

This means that the optical elements 61 and 62 originally have an aspherical amount of $\pm2.86$ microns.

In order to reduce the amount of actual deviation from a flat plane, a term of cx which is the first-order term of x may be added to this. Since the value of c with which a value of 2.86 microns is determined in reference to 100 mm is $2.86\times10^{-5}$, the constants a and c may be set with opposite signs, and $$c=-2.86\times10^{-5}$$

may be set. Then, a deviation of an aspherical amount from a flat plane can be reduced up to $\pm1.77$ microns.

Figure 27:
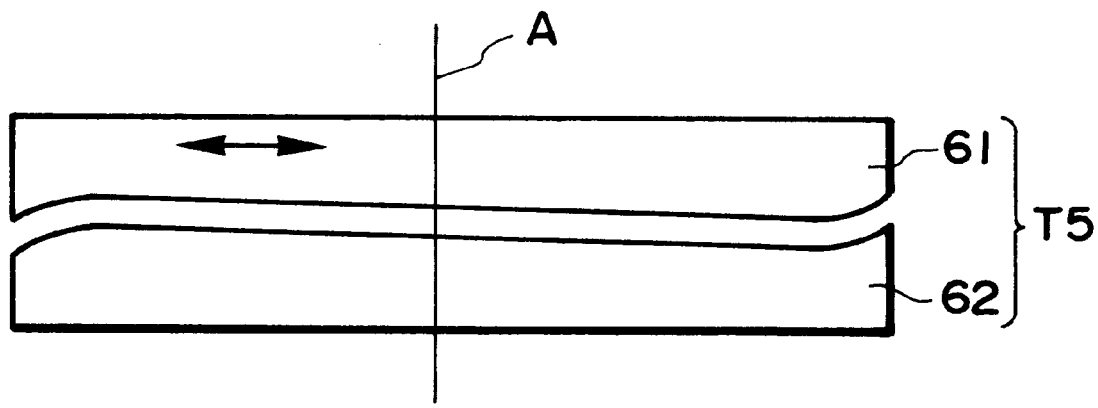
FIG. 27 is an enlarged view of a portion of FIG. 26.
Figure 28:
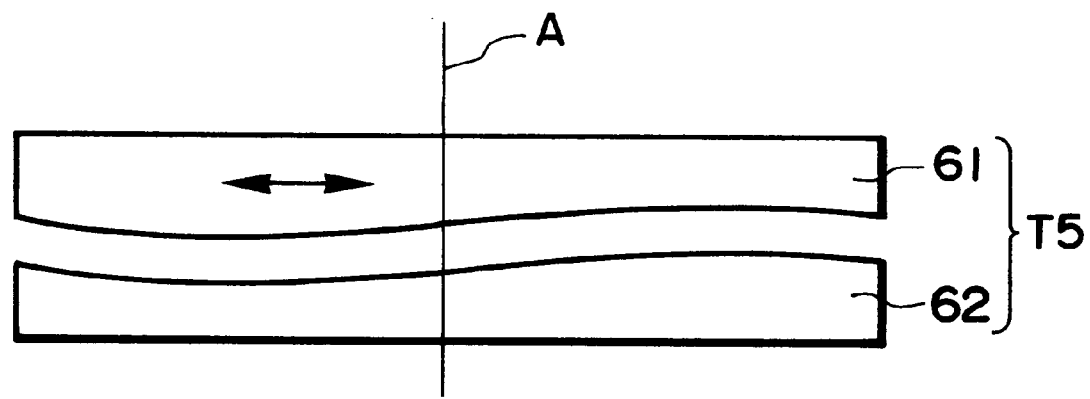
FIG. 28 is an enlarged view of a portion of FIG. 26.

FIG. 27 shows the aspherical surface shapes when c is zero, while FIG. 28 shows the shapes when the above-described value is substituted into c. Since within the range of diameter of 200 mm the aspherical surfaces have slowly changing shapes and, additionally, the optical elements 61 and 62 have mutually complementing shapes, production of aberration resulting from a change in relative position of the optical elements 61 and 62 does not apply substantial influence to the other optical characteristics. Thus, only the higher order distortion can be corrected.

In this embodiment, the direction of correction of the higher order distortion is perpendicular to the scan direction of the exposure apparatus. However, because the amount of correction is small and an absolute value of shift can be suitably selected, the aspherical surface to be used can be small as can be measured by use of an interferometer.

In this embodiment, a desired optical characteristic can be produced by the amount of shift of two aspherical surfaces and, therefore, the original aspherical amount, that is, the aspherical amount of the optical element 61 or 62 itself is larger than that which is to be finally obtained. In the example described above, an aspherical surface of 2.86 microns is required for each of the optical elements, in order to attain an aspherical amount of 1 micron. When tilt optimization is made in addition to this, the amount can be reduced to 1.77 microns, which is sufficiently within the range of high precision measurement of an interferometer.

In the manufacture of an aspherical surface, it is important that a product surface exactly has a surface shape desired. However, because the aspherical amount required in this embodiment is such as described, conventional techniques may be applied satisfactorily. If further reduction of the amount is desired, the shift amount of 5 mm may be enlarged.

Actuation of the aspherical surface optical elements may be changed in accordance with a sequence (data) which may be memorized beforehand in the apparatus, or it may be made on the basis of an actual measured value of a wafer. For example, if the higher order distortion changes with different illumination modes or different numerical apertures, the amount of change may be memorized beforehand and lateral shift of the aspherical surface optical elements may be done in response to the change of illumination mode or numerical aperture. On such an occasion, the magnification component and lower order distortion such as third order distortion may be corrected simultaneously by using any known means.

In place of such preparatory setting, a reticle with which distortion measurement is attainable may be used to analyze the distortion within the picture field, and the magnification component and distortion components up to higher orders may be corrected on the basis of the resultant value. On such an occasion, measurement may be made automatically within the apparatus or it may be made in the off-line manner wherein an image of a reticle is once printed on a wafer and measurement is made thereto.

FIG. 29 shows a main portion of a semiconductor exposure apparatus according to an eleventh embodiment of the present invention. It differs from the tenth embodiment in that the optical means T5 is provided between a wafer 23 and a projection optical system 2. The remaining portion has essentially the same structure and function as that of the tenth embodiment.

In the tenth and eleventh embodiments described above, only one of two aspherical surface optical elements disposed opposed to each other is moved to obtain a desired optical characteristic. However, the relative motion of opposed optical elements is not limited to this. For example, the upper optical element 61 may be moved rightwardly by $\Delta$ while the lower optical element 62 may be moved leftwardly by $\Delta$.

In these embodiments, distortions up to fifth order distortions have been considered. If distortions still higher than them are to be considered, higher order terms such as a ninth order term or higher may be included as the shape of the aspherical surface.

In the tenth and eleventh embodiments described above, higher order distortion which could not be corrected conventionally can be corrected variably within the projection exposure apparatus. As a result, a variation of distortion resulting from changes in illumination mode or numerical aperture, or distortion matching between different apparatuses, for example, can be adjusted variably. Thus, overlay precision in the manufacture of devices such as semiconductor devices can be improved significantly.

Since higher order distortion is variably provided, it is possible to meet various changes. Further, because the aspherical amount required is small, the effect to the other optical characteristics is small.

In the tenth and eleventh embodiments, the direction in which higher order distortion is produced is perpendicular to the scan direction of the scan type exposure apparatus. Since distortion correction can be made with respect to the direction in which there is no averaging effect of scan, the balance of the system as a whole is improved. Thus, also the overall alignment precision can be improved.

Further, in the above-described examples, the higher order distortion correction is made only with respect to a direction perpendicular to the scan direction. However, where the slit width in the scan direction is enlarged or the invention is to be applied to a stepper, the shape of an aspherical surface may be made as follows:

$$ga(x, y)=a(x^7+7x^6y)+b1$$

$$gb(x, y)=a(x^7+7x^6y)+b2 \quad (4e)$$

In the initial stage, the aspherical surface shape ga(x, y) and the aspherical surface shape gb(x, y) can be completely fitted to each other and, therefore, the optical elements 61 and 62 have no optical power and they function in a unit merely as a parallel flat plate. The spacing between the optical elements 61 and 62 may preferably be made small as much as possible, and typically it may be about 100 microns, for example. Here, a case where the optical element 61 is shifted in the X direction by a distance $\Delta$ is considered. The influence produced here is, if the effect of a higher order term of $\Delta$ is disregarded because it is small, as follows:

$$ga(x+\Delta, y)-gb(x, y)=7a\Delta(x^6+y^6)+(b1-b2) \quad (5e)$$

It is important in this embodiment that equation (5e) includes a term $(x^6+y^6)$. Thus, as a result of a lateral shift of an amount $\Delta$, the optical elements 61 and 62 provide an optical system having a six-order characteristic which is revolutionally symmetric with respect to the optical axis and, additionally, this characteristic can be changed as desired with the amount of lateral shift $\Delta$.

The procedure of producing lateral shift to provide a deviation, just corresponds to differentiation. For this reason, a seventh order term is included as the shape of the aspherical surface, and a sixth order component is provided due to the effect of differentiation. This is the function of the optical elements 61 and 62.

In this manner, the higher order distortion can be controlled as desired. As regards the position of the optical elements 61 and 62, they may be disposed between a reticle and a projection optical system, as in the preceding embodiment, or alternatively, they may be disposed between the projection optical system and a wafer. Further, if desired, they may be provided within the projection optical system.

Next, an embodiment of a semiconductor device manufacturing method which uses a projection exposure apparatus as having been described above, will be explained.

Figure 30:
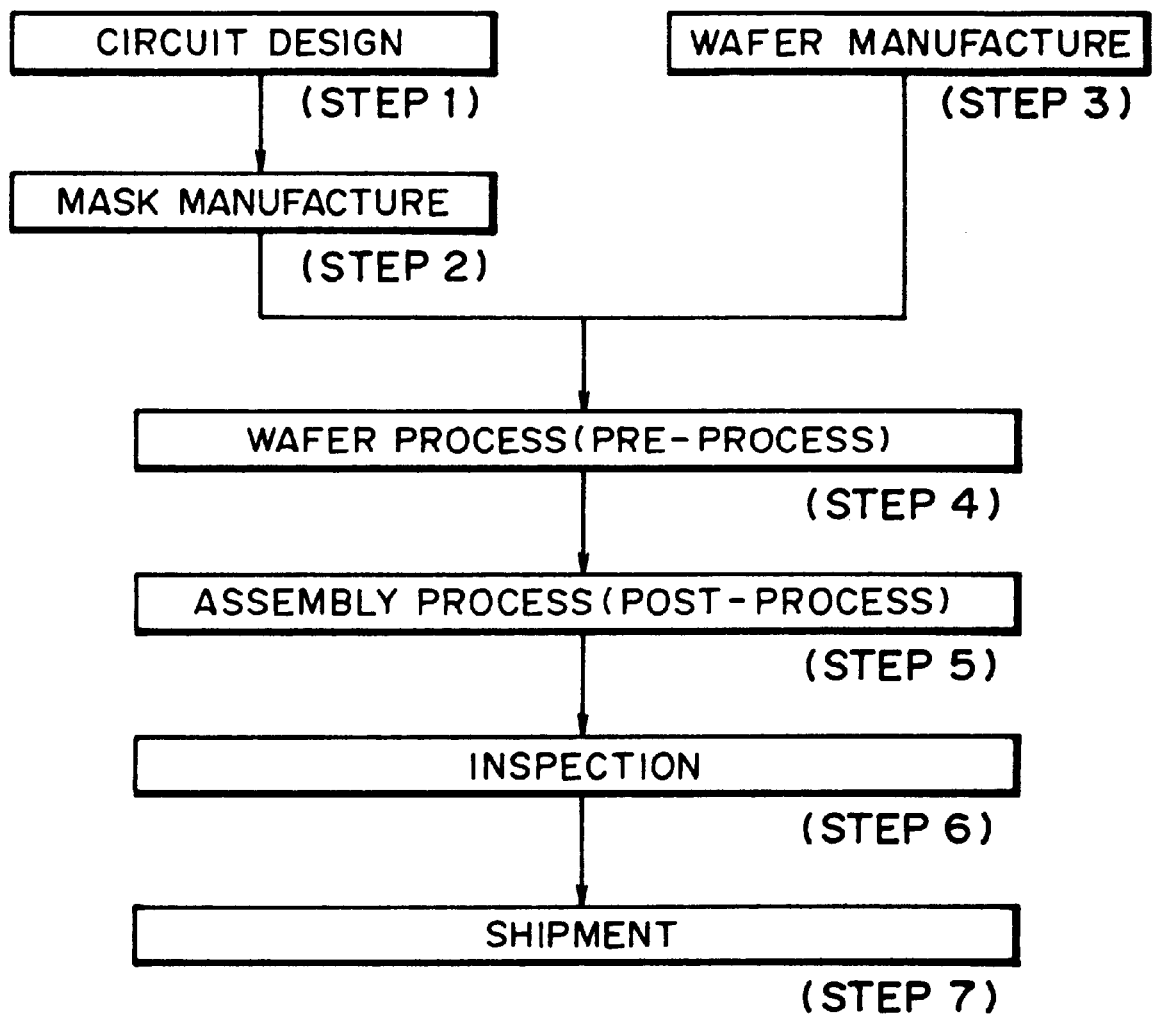
FIG. 30 is a flow chart of semiconductor device manufacturing processes.

FIG. 30 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 31:
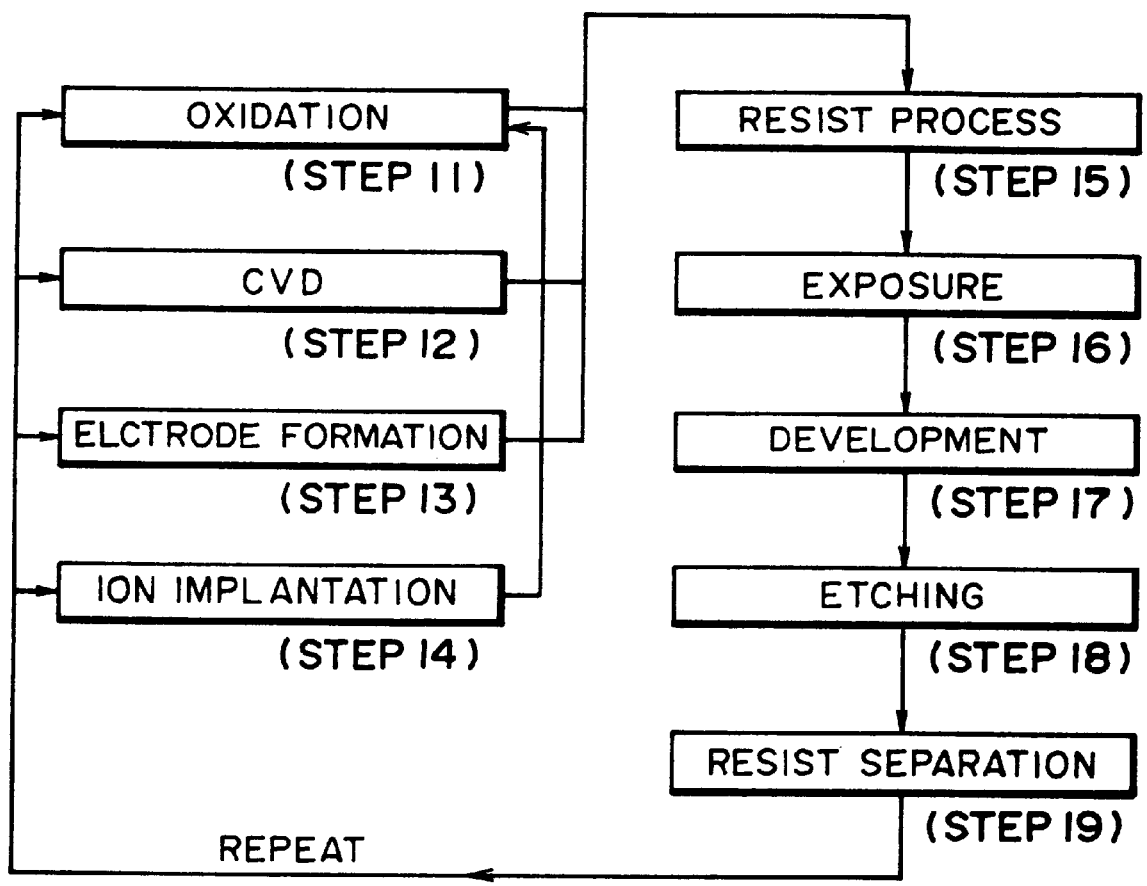
FIG. 31 is a flow chart for explaining details of the semiconductor device manufacturing procedure.

FIG. 31 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as have been described above, for changes in optical characteristics of a projection optical system due to absorption of exposure light, such as axial astigmatism, curvature of image field, or for asymmetrical magnification or distortion of a wafer itself to be produced in wafer processes, there is provided optical means having at least two optical elements with aspherical surfaces being set appropriately to at least one of the variations mentioned above. This effectively corrects the variation concerned, with an adverse effect to the other optical characteristic being kept minimum. Thus, the present invention provides a projection exposure apparatus and/or a device manufacturing method with which high resolution patterns are produced easily.

Further, with these embodiments of the present invention, distortion matching between different apparatuses or an error of a reticle pattern can be corrected by use of optical means having paired optical elements with appropriately set aspherical surfaces, this being done by independently controlling magnifications in X and Y directions.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

a projection optical system for projecting a pattern of a mask onto a substrate, said projection optical system comprising a pair of aspherical members, at least one of which is displaceable in a direction orthogonal to an optical axis of said projection optical system, said pair of aspherical members having their aspherical surfaces disposed opposed to and close to each other, the aspherical surfaces having shapes which are mated with each other when placed in a particular positional relation, wherein (i) said aspherical members have aspherical surface shapes which are determined so that an optical characteristic of said aspherical members as a unit changes with a change in positional relationship between the aspherical surfaces of said aspherical members with respect to the orthogonal direction, (ii) an optical characteristic of said projection optical system is adjustable in response to displacement of said at least one of said aspherical members in the direction orthogonal to the optical axis and (iii) when said pair of aspherical members shifts in opposite directions, along the direction orthogonal to the optical axis and by the same amount, the positional relationship between the aspherical surfaces changes.

2. An apparatus according to claim 1, wherein the optical characteristic includes axial astigmatism.

3. An apparatus according to claim 2, wherein the shapes of the aspherical surfaces of said paired aspherical surface members satisfy the equations:

$$fa(x,y)=ax^3+bx^2+cx+d_1$$

$$fb(x,y)=ax^3+bx^2+cx+d_2,$$

in which the x and y axes extend perpendicular to the optical axis, the aspherical surface of one optical element is denoted by fa(x,y) while the aspherical surface of an opposing optical element is denoted by fb(x,y), the direction of shift is the x direction and a, b, c, $d_1$ and $d_2$ are constants.

4. An apparatus according to claim 3, wherein said projection exposure apparatus performs projection exposure with a scan of the mask and the substrate, and wherein the direction of x is perpendicular to a direction of the scan.

5. An apparatus according to claim 1, wherein the optical characteristic includes curvature of field.

6. An apparatus according to claim 5, wherein the shapes of the aspherical surfaces of said paired aspherical surface members satisfy the equations:

$$fa(x,y)=a(3xy^2+x^3)+b(2xy+x^2)+cx+d_1$$

$$fb(x,y)=a(3xy^2+x^3)+b(2xy+x^2)+cx+d_2,$$

in which the x and y axes extend perpendicular to the optical axis, the aspherical surface of one optical element is denoted by fa(x,y) while the aspherical surface of an opposing optical element is denoted by fb(x,y), the direction of shift is the x direction and a, b, c, $d_1$ and $d_2$ are constants, and wherein the optical characteristic includes curvature of field with respect to the x direction.

7. An apparatus according to claim 6, wherein said projection exposure apparatus performs projection exposure with a scan of the mask and the substrate, and wherein the direction of x is perpendicular to a direction of the scan.

8. An apparatus according to claim 6, further comprising another pair of transparent aspherical members having their aspherical surfaces disposed close to each other and having shapes to be mated with each other when they are disposed in a predetermined positional relationship with each other, wherein the positional relation between the aspherical surfaces of said other pair of transparent aspherical members changes when they move in opposite directions along a Y direction, orthogonal to the optical axis and to the X direction, by the same amount, to thereby cause a change in curvature of field of said projection optical system with respect to the Y direction.

9. An apparatus according to claim 8, wherein the two pairs of aspherical surface members adjust curvature of field and axial astigmatism of said apparatus.

10. An apparatus according to claim 8, wherein the two pairs of aspherical surface members include a common member having aspherical surfaces on opposite faces thereof.

11. An apparatus according to claim 1, wherein the optical characteristic includes projection magnification.

12. An apparatus according to claim 11, wherein the shapes of the aspherical surfaces of said paired aspherical surface members satisfy the equations:

$$fa(x, y) = ax^3 + bx^2 + cx + d_1$$

$$fb(x, y) = ax^3 + bx^2 + cx + d_2,$$

in which the x and y axes extend perpendicular to the optical axis, the aspherical surface of one optical element is denoted by fa(x,y) while the aspherical surface of an opposing optical element is denoted by fb(x,y), the direction of shift is the x direction and a, b, c, $d_1$ and $d_2$ are constants, and wherein the optical characteristic includes projection magnification with respect to the x direction.

13. An apparatus according to claim 12, wherein said projection exposure apparatus performs projection exposure with a scan of the mask and the substrate, and wherein the direction of x is perpendicular to a direction of the scan.

14. An apparatus according to claim 1, wherein the optical characteristic includes distortion.

15. An apparatus according to claim 14, wherein the shapes of the aspherical surfaces of said paired aspherical surface members satisfy the equations:

$$ga(x,y)=a(x^5+5x^4y)+b1$$

$$gb(x,y)=a(x^5+5x^4y)+b2,$$

in which the x and y axes extend perpendicular to the optical axis, the aspherical surface of one optical element is denoted by ga(x,y) while the aspherical surface of an opposing optical element is denoted by gb(x,y), the direction of shift is the x direction and a, b1 and b2 are constants.

16. An apparatus according to claim 15, wherein said projection exposure apparatus performs projection exposure with a scan of the mask and the substrate, and wherein the direction of x is perpendicular to a direction of the scan.

17. An apparatus according to claim 14, wherein the shapes of the aspherical surfaces of said paired aspherical surface members satisfy the equations:

$$ga(x,y)=a(x^7+7x^6y)+b1$$

$$gb(x,y)=a(x^7+7x^6y)+b2,$$

in which the x and y axes extend perpendicular to the optical axis, the aspherical surface of one optical element is denoted by ga(x,y) while the aspherical surface of an opposing optical element is denoted by gb(x,y), the direction of shift is the x direction and a, b1 and b2 are constants.

18. An apparatus according to claim 17, wherein said projection exposure apparatus performs projection exposure with a scan of the mask and the substrate, and wherein the direction of x is perpendicular to a direction of the scan.

19. A projection exposure apparatus, comprising:

a projection optical system for projecting a pattern of a mask onto a substrate, said projection optical system comprising a pair of aspherical members, at least one of which is displaceable in a direction orthogonal to an optical axis of said projection optical system, said pair of aspherical members having their aspherical surfaces disposed opposed to and close to each other, the aspherical surfaces having shapes which are mated with each other when placed in a particular positional relation, wherein (i) said aspherical members have aspherical surface shapes which are determined so that a refracting power of said aspherical members changes with a change in positional relationship between the aspherical surfaces of said aspherical members with respect to the orthogonal direction, (ii) a refracting power of said projection optical system is adjustable in response to displacement of said at least one of said aspherical members in the direction orthogonal to the optical axis and (iii) when said Pair of aspherical members shifts in opposite directions, alone a direction orthogonal to the optical axis and by the same amount, the positional relationship between the aspherical surfaces chances.

20. A projection exposure apparatus, comprising:

a projection optical system for projecting a pattern of a mask onto a substrate, said projection optical system comprising a pair of aspherical members, at least one of which is displaceable in a direction orthogonal to an optical axis of said projection optical system, said pair of aspherical members having their aspherical surfaces disposed opposed to and close to each other, the aspherical surfaces having shapes which are mated with each other when placed in a particular positional relation, wherein (i) said aspherical members have aspherical surface shapes which are determined so that an amount of aberration of said aspherical members as a unit changes with a change in positional relationship between the aspherical surfaces of said aspherical members with respect to the orthogonal direction, (ii) an aberration of said projection optical system is adjustable in response to displacement of said at least one of said aspherical members in the direction orthogonal to the optical axis and (iii) when said pair of aspherical members shifts in opposite directions, along a direction orthogonal to the optical axis and by the same amount, the positional relationship between the aspherical surfaces changes.

21. A device manufacturing method, comprising the steps of:

supplying a mask having a device pattern and a wafer to a projection exposure apparatus as recited in any one of claims 1 through 20;

adjusting an optical characteristic of the projection optical system of the projection exposure apparatus; and projecting, after the adjustment, an image of the device pattern of the mask onto the wafer by use of the projection optical system, to transfer the device pattern to the mask.

* * * * *

UNITED STATES PATENT AND TRADEMARK OFFICE
CERTIFICATE OF CORRECTION

PATENT NO. : 6,104,472

DATED : August 15, 2000

INVENTOR(S) : Akiyoshi Suzuki

It is certified that error appears in the above-identified patent and that said Letters Patent is hereby corrected as shown below:

ON THE COVER PAGE
Item [56], under "References Cited", "FOREIGN PATENT DOCUMENTS", "43-10034  4/1943  Japan" should be deleted.

IN THE DRAWINGS:
SHEET 20
Figure 31, in Step 13, "ELCTRODE" should read --ELECTRODE--.

IN THE DISCLOSURE:
COLUMN 7
Line 63, "$fa(x+\Delta, y)-fb(x, y)=3a\Delta x^{2+}(d_1-d_2)$" should read
--$fa(x+\Delta, y)-fb(x, y)=3a\Delta x^2+(d_1-d_2)$--.

COLUMN 9
Line 33, "+2.6" should read --$\pm 2.6$--.

COLUMN 13
Line 61, "attribute" should read --be attributed--; and
Line 67, "processes intermediate" should read --intermediate processes--.

UNITED STATES PATENT AND TRADEMARK OFFICE
CERTIFICATE OF CORRECTION

PATENT NO. : 6,104,472

DATED : August 15, 2000

INVENTOR(S) : Akiyoshi Suzuki

It is certified that error appears in the above-identified patent and that said Letters Patent is hereby corrected as shown below:

COLUMN 15
Line 35, "(d1-$d_2$)" should read --($d_1$-$d_2$)--; and
Line 37, "Here," should read --Here, a--.

COLUMN 19
Line 20, "0 drive" should read --$\theta$ drive--.

COLUMN 23
Line 38, "2a[3$\delta$($x^2$+$y^2$)+$\delta^3$]2" should read
--2a[3$\delta$($x^2$+$y^2$)+$\delta^3$]--; and
Line 40, "it," should read --if,--.

COLUMN 28
Line 38, "follow:" should read --follows:--.

UNITED STATES PATENT AND TRADEMARK OFFICE
CERTIFICATE OF CORRECTION

PATENT NO. : 6,104,472

DATED : August 15, 2000

INVENTOR(S) : Akiyoshi Suzuki

It is certified that error appears in the above-identified patent and that said Letters Patent is hereby corrected as shown below:

COLUMN 38
Line 1, "Pair" should read --pair--; and
Line 4, "chances." should read --changes.--.

Signed and Sealed this

Twenty-ninth Day of May, 2001

Attest:

NICHOLAS P. GODICI

Attesting Officer

Acting Director of the United States Patent and Trademark Office